US005723053A

United States Patent [19]

Momose et al.

[11] Patent Number: 5,723,053

[45] Date of Patent: Mar. 3, 1998

[54] INK JET PRINT HEAD AND A METHOD OF MANUFACTURING THE SAME

[75] Inventors: Kaoru Momose; Takahiro Katakura; Kazumi Kamoi; Kazunaga Suzuki; Takahiro Naka; Kazuhiko Miura; Tatsuo Furuta; Shinri Sakai, all of Nagano, Japan

[73] Assignee: Seiko Epson Corporation, Tokyo, Japan

[21] Appl. No.: 682,883

[22] Filed: Jul. 12, 1996

Related U.S. Application Data

[62] Division of Ser. No. 336,060, Nov. 4, 1994.

[30] Foreign Application Priority Data

| | | | |
|---|---|---|---|
| Nov. 9, 1993 | [JP] | Japan | 5-279857 |
| Nov. 10, 1993 | [JP] | Japan | 5-301150 |
| Dec. 9, 1993 | [JP] | Japan | 5-341312 |
| Dec. 24, 1993 | [JP] | Japan | 5-328581 |
| Dec. 24, 1993 | [JP] | Japan | 5-328582 |
| Apr. 14, 1994 | [JP] | Japan | 6-100636 |
| Jun. 2, 1994 | [JP] | Japan | 6-121479 |
| Jul. 20, 1994 | [JP] | Japan | 6-168264 |

[51] Int. Cl.$^6$ ..... H01L 21/00

[52] U.S. Cl. ..... 216/27; 216/2; 216/33

[58] Field of Search ..... 156/647.1, 633.1; 216/2, 27, 33; 347/71

[56] References Cited

U.S. PATENT DOCUMENTS

| | | |
|---|---|---|
| 4,047,184 | 9/1977 | Bassous et al. . |
| 4,216,477 | 8/1980 | Matsuda et al. . |
| 4,312,008 | 1/1982 | Taub et al. . |
| 4,600,934 | 7/1986 | Aine et al. . |
| 5,096,535 | 3/1992 | Hawkins et al. . |

FOREIGN PATENT DOCUMENTS

| | | |
|---|---|---|
| 0328281 | 8/1989 | European Pat. Off. . |
| 0479441A2 | 4/1992 | European Pat. Off. . |
| 0600382A2 | 6/1994 | European Pat. Off. . |
| 54-150127 A | 11/1979 | Japan . |
| 2280325 | 11/1990 | Japan . |
| 03 079350 A | 4/1991 | Japan . |
| 03 121850 A | 5/1991 | Japan . |
| 05 229114 A | 9/1993 | Japan . |
| 05 229123 A | 9/1993 | Japan . |
| 05 254146 A | 10/1993 | Japan . |

*Primary Examiner*—William Powell
*Attorney, Agent, or Firm*—Sughrue, Mion, Zinn, Macpeak & Seas, PLLC

[57] ABSTRACT

An ink jet printer head includes a spacer including pressure generating chambers continuous to nozzle openings, ink supply paths, and reservoirs, a cover member for covering the pressure generating chambers in a sealing fashion, and pressure generating means for generating pressure in the pressure generating chambers in accordance with print data. In processing a silicon single-crystal substrate vertically oriented in (110) by anisotropic etching process, one of the walls of a path hole for forming a pressure generating chamber is aligned with one of the walls of a path hole for forming a reservoir. Walls defining the path hole for forming a pressure generating chamber, which are located in the vicinity of a nozzle opening, are connected to each other at an obtuse angle. As a result, the ink supply path serving as a narrow path for ink flow and the pressure generating chamber are formed as smooth flow paths. The walls in an area in the vicinity of the nozzle opening where ink tends to stay are substantially equally distanced from the nozzle opening. A smooth flow of ink is ensured.

11 Claims, 31 Drawing Sheets

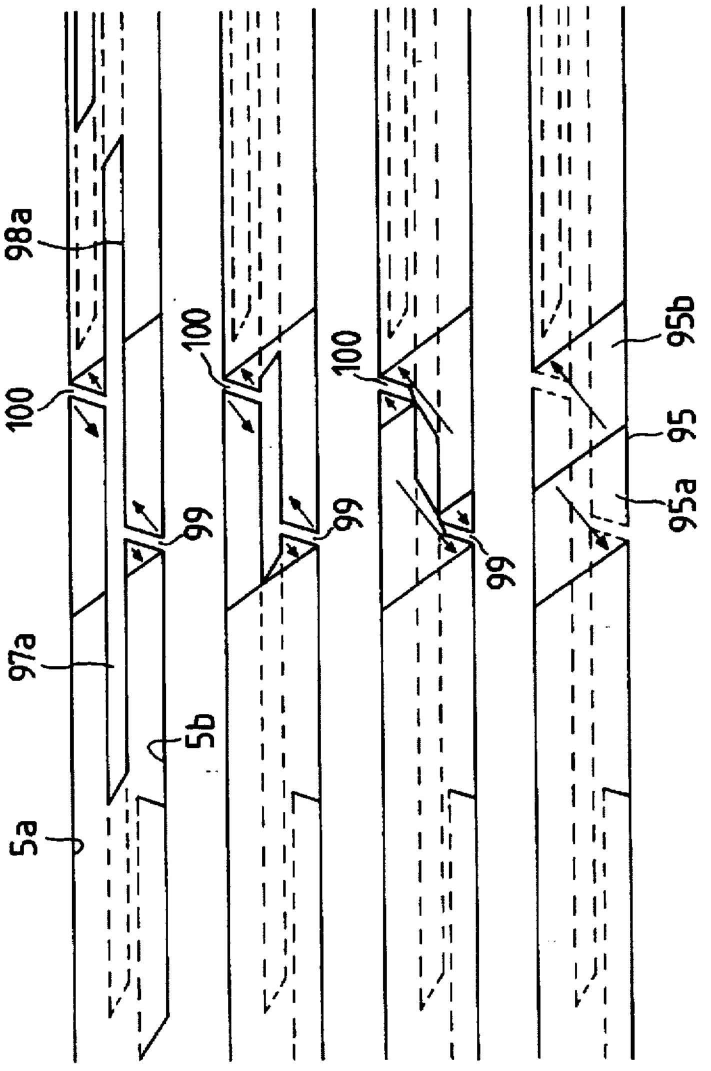
FIG. 28(a)
FIG. 28(b)
FIG. 28(c)
FIG. 28(d)
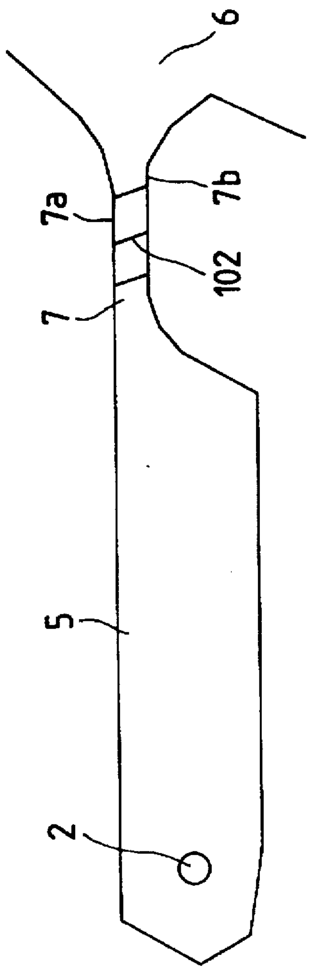
FIG. 29

INK JET PRINT HEAD AND A METHOD OF MANUFACTURING THE SAME

This is a divisional of application Ser. No. 08/336,060 filed Nov. 4, 1994.

BACKGROUND OF THE INVENTION

1. Field of the Invention

The present invention relates to an ink jet printer head in which a spacer for setting a cover member and a nozzle plate with nozzle openings fixed distance apart and having pressure generating chambers, reservoirs, and ink supply paths connecting them, is formed of a silicon single-crystal substrate.

2. Related Art

An ink jet printer head shoots forth ink droplets onto a recording medium to form dots thereon. Print of extremely high resolution is realized if the size of the ink droplets is reduced. For high speed printing, the number of nozzle openings must be increased. Particularly, in the printer head of the type in which piezoelectric vibrating elements are used as an energy source for expelling ink droplets, the pressure generating chamber must be designed to be as large as possible in order to efficiently use the energy of the piezoelectric vibrating element. This requirement for the efficient use of the energy is contradictory to the current tendency of the size reduction of the printer head.

Measure currently taken for the contradictory problem is to reduce the thickness of the wall partitioning the adjacent pressure generating chambers, and to enlarge the pressure generating chambers in the longitudinal direction.

To form the pressure generating chambers and the reservoirs, path holes are formed in the spacer for setting the vibrator plate and the nozzle plate fixed distance apart. Since the path holes must be formed in conformity with the pressure generating chambers that are extremely small and complicatedly shaped, the etching technique is usually used.

A photosensitive resin film is usually used for the spacer. The spacer made of photosensitive resin has a small mechanical strength. The printer head using such a defective spacer suffers from cross talk, deflection, and the like, and attempt to achieve high resolution is accompanied by deterioration of print quality.

To cope with this problem, there are some proposals as disclosed U.S. Pat. No. 4,312,008 and Examined Japanese Patent Publication No. Sho. 58-40509. In the proposals, a silicon single-crystal substrate vertically oriented in (110) is cut out so as to have the thickness suitable for the spacer. Path holes shaped for pressure generating chambers and ink supply paths are formed in the silicon single-crystal substrate by anisotropic etching process. The spacer of the silicon single-crystal substrate has a large mechanical strength. Therefore, the deflection of the whole print head caused by deformation of the piezoelectric vibrating elements is minimized. The walls undergoing etching are substantially vertical to the surface of the spacer. Because of this, the pressure generating chambers can be uniformly formed.

This spacer has the following problem, however. The walls formed by the etching are limited in their directions by the crystal face orientation. Therefore, it is difficult to shape the pressure generating chambers ideal for the ink jet printer head. Because of the unsatisfactorily shaped pressure generating chambers, ink tends to stay and to generate bubbles in the pressure generating chambers.

The spacer formed of the silicon single-crystal substrate is advantageous in that the pressure generating chambers may be reduced in size, but is disadvantageous in that a mechanical strength of the whole spacer is small. Because of the fragile spacer, it is difficult to handle the spacers in assembling the ink jet printer head. Further, it is difficult to secure a compliance sufficient for effectively utilizing the pressure energy generated by the piezoelectric vibrating elements and the heat generating means.

SUMMARY OF THE INVENTION

Accordingly, a first object of the present invention is to provide an ink jet printer head using such a spacer, formed of a silicon single-crystal substrate, that the smooth flow paths from the ink supply paths (tending to serve as narrow paths) to the pressure generating chambers may be formed, ensuring smooth supply of ink to the pressure generating chambers and smooth discharge of ink bubbles.

Another object of the present invention is to provide a novel ink jet printer head which allows the spacer thereof formed of a thin silicon single-crystal substrate of approximately 200 μm thick to easily be handled.

Yet another object of the present invention is to provide a novel ink jet printer head in which the pressure generating chambers reduced in size have compliance large enough to shoot forth ink droplets.

Still another object of the present invention is to provide a method of manufacturing the ink jet printer head, more particularly an etching method for forming a spacer by etching a silicon single-crystal substrate.

To achieve the above objects, there is provided an ink jet printer head having a nozzle plate having an array of nozzle openings, a spacer including path holes for forming pressure generating chambers, ink supply paths, and reservoirs, a vibrator plate receiving vibrations of piezoelectric vibrating elements, and the piezoelectric vibrating elements longitudinally vibrating in accordance with print data. In the ink jet printer head, the spacer includes a silicon single-crystal substrate vertically oriented in (110) that is processed by anisotropic etching process such that one of the walls defining a path hole forming a pressure generating chamber is continuous to one of the walls defining a path hole forming an ink supply path.

The ink supply paths where ink tends to stay and the pressure generating chambers are formed in a plane, thereby ensuring a smooth flow of ink, and preventing stay of ink bubbles.

Also in the present invention, there is provided an ink jet printer head having a spacer, and pressure generating means formed by two cover plates located sandwiching the spacer therebetween, ink supply paths connecting the nozzle openings and the reservoirs being provided in connection with the pressure generating chambers, the pressure generating chambers being provided with pressure generating sources. In the ink jet printer head, the spacer is a silicon single-crystal substrate vertically oriented in (110) that is processed by anisotropic etching process such that the pressure generating chamber is formed by a path hole with a bridge means.

The bridge means of the path hole prevents the partition walls defining the pressure generating chambers from falling down.

The partition walls for partitioning the pressure generating chambers are each separated by a space in the form of a slit, and the partition walls are deformed when receiving a pressure that is applied to ink for ink discharge.

With the deformation of the walls of the pressure generating chambers at the time of shooting forth ink, a compliance large enough to shoot forth ink is secured.

Additionally, there is provided a method of processing a silicon single-crystal substrate in use with an ink jet printer head in which patterns of anisotropic etching protecting patterns made of silicon dioxide, coincident in configuration with patterns for forming path holes, are formed, in a mirror image fashion, on the obverse and the reverse sides of a silicon single-crystal substrate vertically oriented in (110), having a fixed thickness, and the silicon single-crystal substrate with the patterns formed thereon is processed from the obverse and the reverse sides thereof by anisotropic etching process, thereby forming the path holes, etching protecting patterns defining a narrow, second pattern connected to a relatively large, first pattern, which are located in regions where the first pattern and the second pattern are to be formed, are aligned with each other, and a blade-like etching protecting pattern is formed in parallel with the second path hole while being substantially aligned with a second wall.

This manufacturing method controls the etching so as not to be excessive, using the blade-like etching patterns. Therefore, fine and precise path holes can be formed in the silicon single-crystal substrate.

BRIEF DESCRIPTION OF THE DRAWINGS

FIG. 29 is a plan view showing another path hole forming the pressure generating chamber;

DETAILED DESCRIPTION OF THE PREFERRED EMBODIMENT

Figure 1:
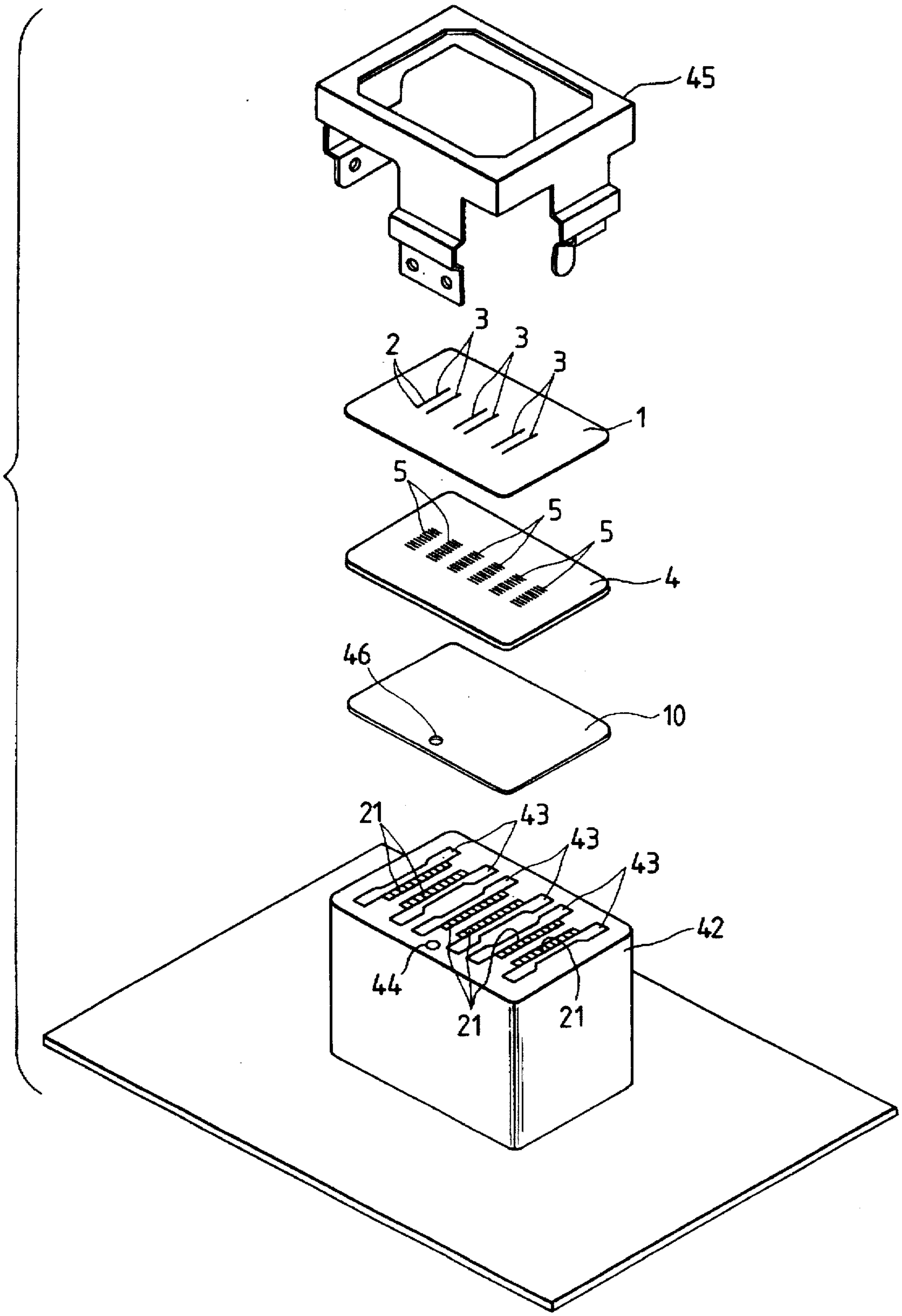
FIG. 1 is an exploded vies showing an ink jet printer head according to an embodiment of the present invention.

In FIG. 1 showing an embodiment of the present invention, linear opening arrays 3 each consisting nozzle openings 2 are formed in a nozzle plate 1. These nozzle openings 2 are linearly arrayed at such pitches as to form a print density of 180 DPI.

Figure 2:
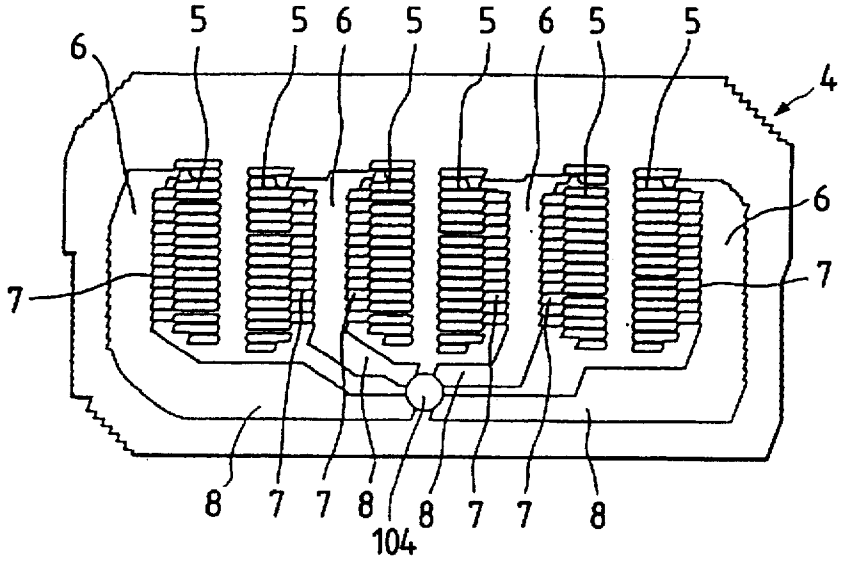
FIG. 2 is a plan view showing a spacer used in the ink jet printer head.
Figure 3:
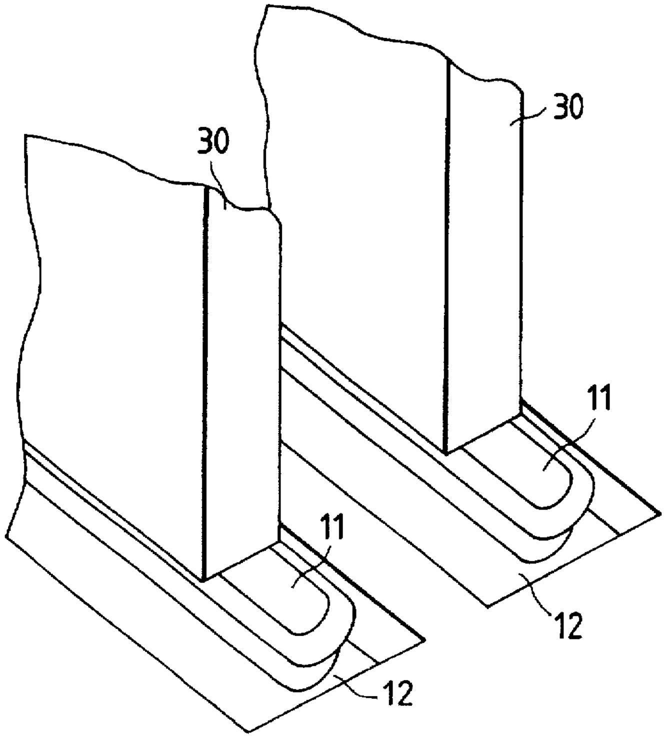
FIG. 3 is an enlarged, perspective view showing a portion of a vibrator plate where it is in contact with piezoelectric vibrating elements.

A spacer 4 is sandwiched between a vibrator plate 10 serving as a first cover plate (to be given later) and the nozzle plate 1 as a second cover plate. As shown in FIG. 2, the spacer 4 contains pressure generating chambers, reservoirs, an ink supply port connecting them, and path holes 5, 6, 7, and 8 for forming fluid paths for distributing ink from an ink tank to the reservoirs.

A vibrator plate 10 cooperates with the spacer 4 and the nozzle plate 1 to form the pressure generating chambers. Each of the pressure generating chambers is formed of an island 11 and a thin portion 12. The island 11, in contact with the top of a piezoelectric vibrating element 30 contained in a piezoelectric vibrator unit 21, has such a rigidity as to transmit a displacement of the piezoelectric vibrating element 30 to the possibly largest area. The thin portion 12 is formed in the peripheral area of the island 11. With such a construction, the pressure generating chamber can efficiently be expanded and compressed in accordance with stretching motions of the piezoelectric vibrating element 30.

Figure 4A:
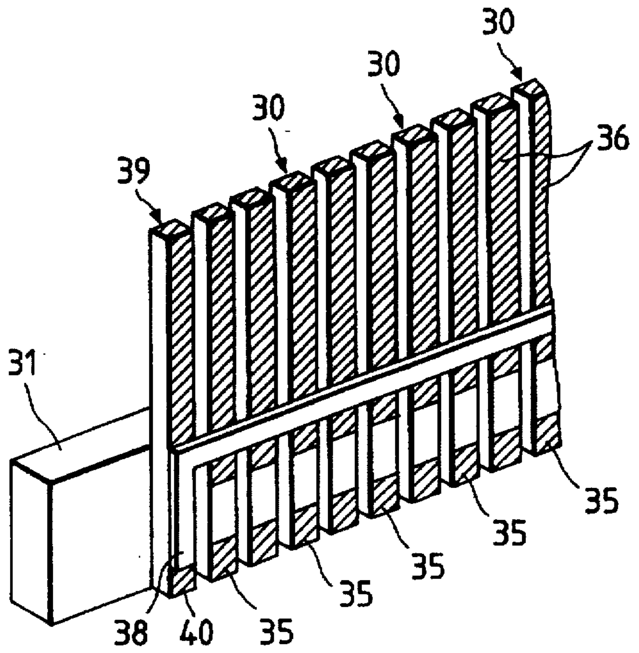
FIGS. 4(*a*) and 4(*b*) are a perspective view and a cross sectional view showing respectively a piezoelectric vibrator unit and the structure of electrodes of the vibrator unit.
Figure 4B:
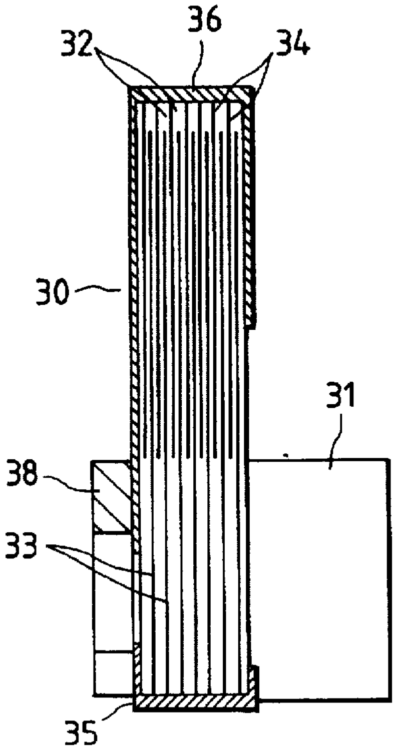

The piezoelectric vibrator units 21 are arranged as shown in FIG. 4(*a*). The piezoelectric vibrating elements 30 of the piezoelectric vibrator units 21 are arrayed at fixed pitches along the fixing board 31 in a state that the first ends of the piezoelectric vibrating elements 30 are attached to the fixing board 31, while the second ends thereof are free so as to allow the piezoelectric vibrating elements 30 to vibrate in a longitudinal vibration mode.

Each piezoelectric vibrating element 30, as shown in FIG. 4(*b*), is constructed such that piezoelectric vibrating members 32, drive electrodes 33, and common electrodes 34 are alternately layered. The rear ends of the drive electrodes 33, exposed to outside, are connected in parallel by an external drive electrode 35, which is formed by vapor deposition process, for example. The common electrodes 34 are extended to the free end of the piezoelectric vibrating element 30 and connected in parallel by an external common electrode 36 extended to the sides of the piezoelectric vibrating element.

The outer major surfaces of the external drive electrodes 35 of the piezoelectric vibrating elements 30 are substantially flush with the fixing board 31. The external common electrodes 36 of the piezoelectric vibrating elements 30 are electrically and physically coupled with electrodes 40 formed on the bottom end faces of dummy vibrating elements 39, which are located on both sides of the array of the piezoelectric vibrating elements 30, by means of a conductive member 38. The electrodes 40, like the external drive electrode 35, are formed on the bottom end faces of the dummy vibrating elements 39, and are to be coupled with a connection circuit board.

Figure 5:
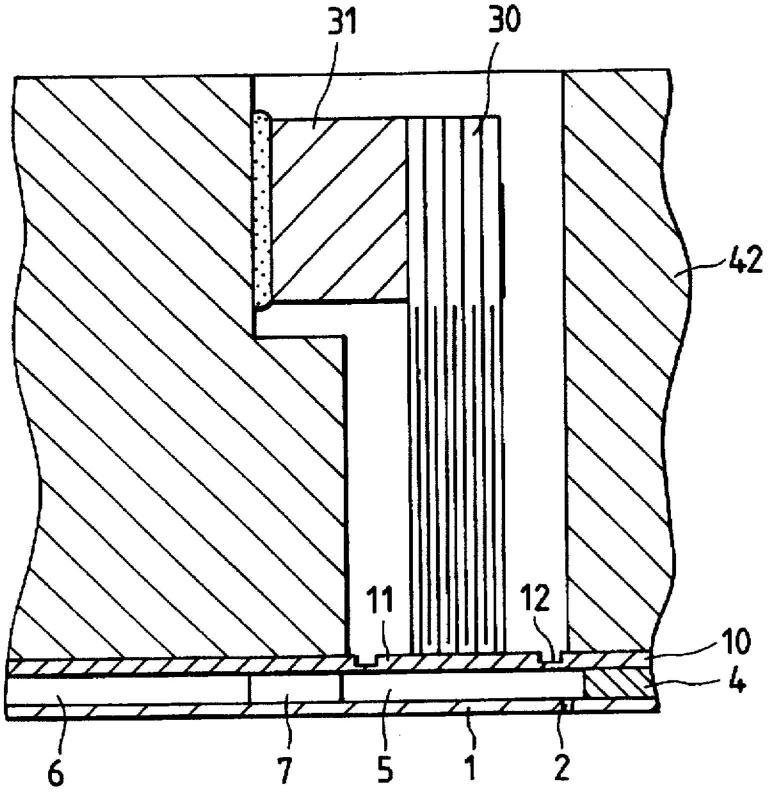
FIG. 5 is a cross sectional view showing a part of the ink jet printer head.

Returning to FIG. 1, a print head body 42 includes unit receive holes 43 for receiving piezoelectric vibrator unit 21 in a state that the free ends of the piezoelectric vibrating element 30 are exposed to outside, and an ink supply port 44 for supplying ink from an ink tank to the reservoirs. An assembly of the vibrator plate 10, the spacer 4, and the nozzle plate 1 is firmly attached to the surface of the print head body 42 by means of a frame member 45, which also serves as an electrostatic shield. The resultant is a record head assembly. FIG. 5 is a cross sectional view of the record head assembly thus constructed when viewed in the direction vertical to the nozzle array. The piezoelectric vibrator units 21 are fastened to the print head body 42 by epoxy resin. Reference numeral 46 designates an inflow port connecting to the ink tank.

Figure 6:
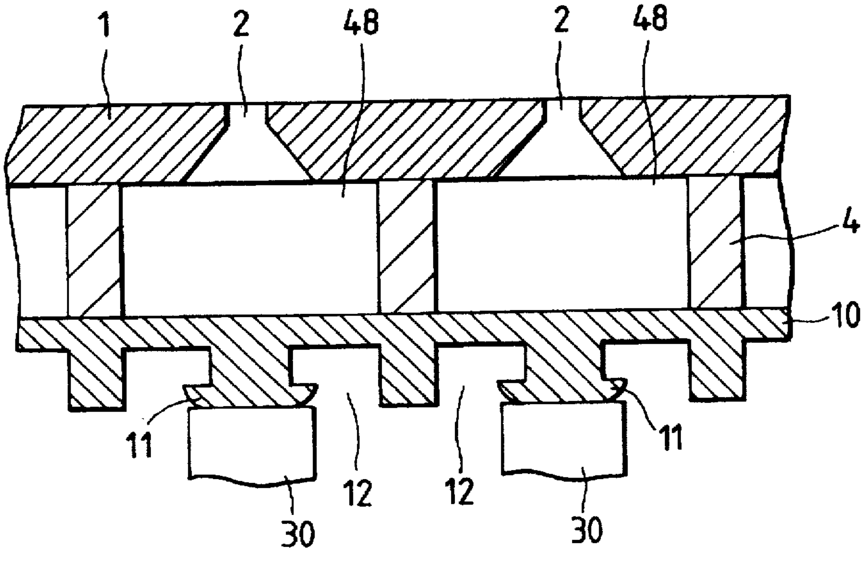
FIG. 6 is an enlarged, cross sectional view showing pressure generating chambers and their related portions of the ink jet printer head.

In the construction of the record head shown in FIG. 1, the path holes 5 of the spacer, as shown in FIG. 6, are closed by the nozzle plate 1 and the vibrator plate 10, thereby forming pressure generating chambers designated by reference numeral 48. When the thin portion 12 of the vibrator plate 10, which receives a stretching motion of the piezoelectric vibrating element 30 through the island 11, is deformed to compress the pressure generating chamber 48, the pressure generating chamber 48 pushes ink contained therein to exterior in the form of ink droplets through the nozzle opening 2.

Figure 7A:
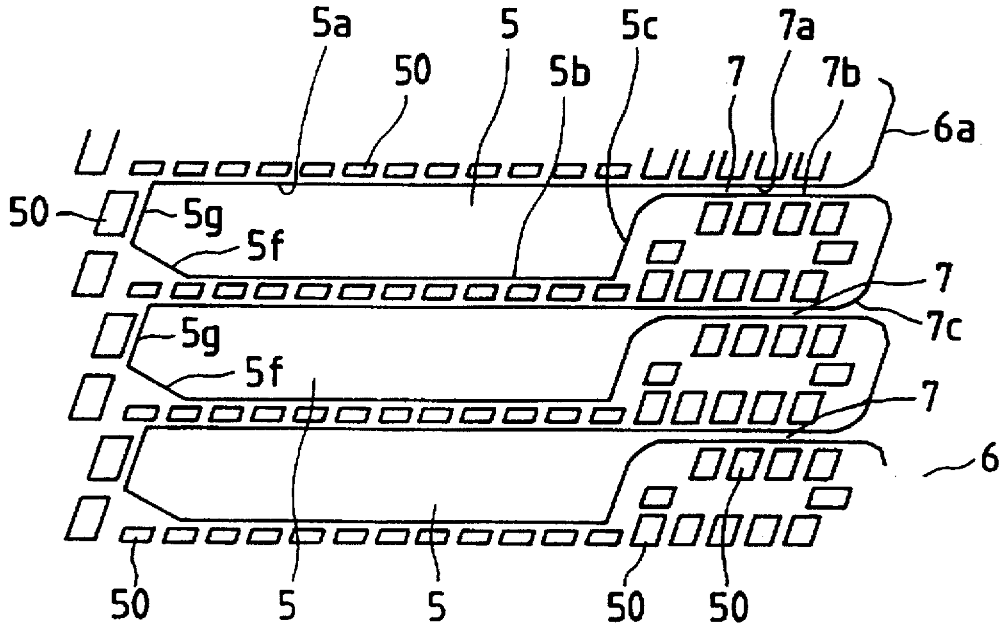
FIGS. 7(*a*) and 7(*b*) are enlarged, plan views showing the pressure generating chambers and their related portions of the spacer in the ink jet printer head, the illustration showing a positional relationship among nozzle openings, islands, and piezoelectric vibrating elements when the nozzle plate, the vibrator plate, and the piezoelectric vibrating element are fastened.
Figure 7B:
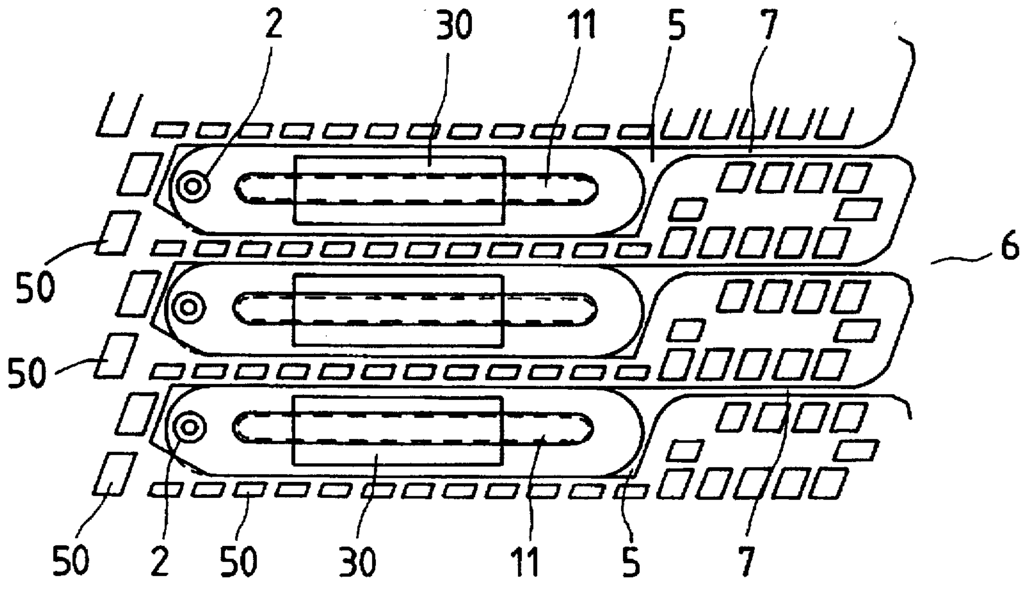

FIGS. 7(*a*) and 7(*b*) are enlarged, plan views showing the path holes 5, which form the pressure generating chambers, and their related portions of the spacer 4 in the ink jet printer head. Path holes 5 to serve as pressure generating chambers 48, path holes 6 to serve as reservoirs, and path holes 7 to serve as ink supply ports are formed in a silicon single-crystal substrate vertically oriented in (110). The silicon single-crystal substrate has the thickness necessary for the spacer, e.g., 220 μm.

The path holes 7 to serve as ink supply ports are each designed such that the walls 7*a* and 7*b* defining the path hole 7 are spaced apart from each other such a distance as to gain a flow path resistance suitable for the ink supply path, and that the wall 7*a* of the path hole 7 is aligned with a wall 5*a* of the path hole 5 forming the pressure-generating chamber 48.

In a case where the vibrator place 10 is bonded to the nozzle plate 1 by adhesive, indentations 50 for receiving adhesive are formed around those path holes by anisotropic etching process. The indentation 50 is approximately 100 μm or shorter long in one of the sides thereof. The depth of the indentation 50 is selected so as to have such a volume as to contain excessive adhesive.

An opening area of the indentation 50 is preferably within a range between 0.001 $mm^2$ and 0.01 $mm^2$. When it is smaller than 0.001 $mm^2$, the indentation 50 can unsatisfactorily receive the excessive adhesive. When it is larger than 0.01 $mm^2$, an unsatisfactory adhesion area is secured, weakening the adhesion of the vibrator plate 10 to the nozzle plate 1.

When an eutectic jointing method, not using adhesive, is used, there is no need of using these indentations 50, as a matter of course.

Figure 8:
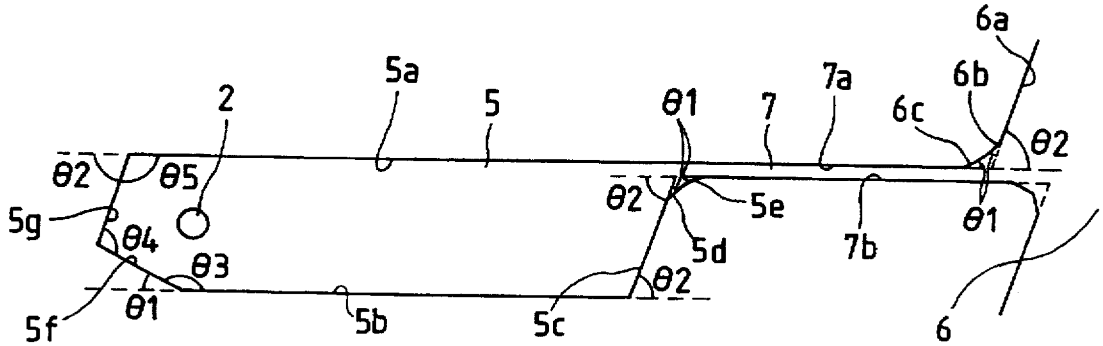
FIG. 8 is an enlarged view showing the configuration of a path hole forming the pressure generating chamber.

FIG. 8 illustrates a path hole forming a pressure generating chamber 48 and a path hole forming an ink supply path, and angles of the walls of these path holes. The path hole 5 forming the pressure generating chamber 48 includes seven walls 5*a* to 5*g*. The walls 5*b*, 5*f*, 5*g*, and 5*a* around the nozzle opening 2 are jointed at angles θ3, θ4, and θ5. The angles θ3, θ4, and θ5 are obtuse angles of approximately 152°, 100°, and 110°, respectively. The walls 5*c*, 5*d*, and 5*e* of the path hole 5, located adjoining to the path hole 7 to serve as the ink supply path, are arranged so as to gradually enlarge a junction area where the ink supply path opens to the pressure generating chamber.

The wall 7*a* of the path hole 7 for the ink supply path is formed so as to be continuous to the wall 5*a* of the path hole 5 for the pressure generating chamber. The wall 7*b* of the path hole 7 is spaced apart from the wall 7*b* and arranged in parallel with the latter. The distance between them is selected to such an extent as to gain a flow path resistance suitable for the ink supply path. The wall 7*a* of the path hole 7, which straightforwardly extends from the pressure generating chambers to the ink supply path, is connected to the wall 6*a* of the path hole 6 for the reservoir by way of an enlarged junction part defined by the two walls 6*b* and 6*c* of the path holes 6. In the figure, an angle θ1 is 30°, and an angle θ2 is approximately 70°.

To assemble, adhesive is applied to the spacer 4 thus structured, and sandwiched by the nozzle plate 1 and the vibrator plate 10 after these are accurately positioned to one another, and the assembly of those components is pressed together. Adhesive not used for bonding them flows into the indentations 50 located around the path holes 5, 6 and 7 respectively for the pressure generating chambers, the ink supply paths, and the reservoirs. As a result, such a disadvantageous situation that adhesive flows into the pressure generating chambers, the ink supply paths, and the reservoirs, thereby changing the volumes of them, will never occur. In the resultant structure produced after completion of the bonding process, each nozzle opening 2 of the nozzle plate 1 is located near at the end of a center line of the path hole 5 to serve as the pressure generating chamber, and each island 11 of the spacer 4 is extended over the substantially entire length of the pressure generating chamber. When the piezoelectric vibrating element 30 is driven in this state, the displacement of the element is transferred to the whole pressure generating chamber by way of the island 11. Therefore, the displacement of the piezoelectric vibrating element 30 can be highly efficiently transformed into a variation of the volume of the pressure generating chamber.

In FIGS. 9(*a*) to (*e*) showing a sequence of steps for manufacturing the spacer 4, a silicon single-crystal substrate 60 of the crystallographic axis (110), 220 μm thick (enough to satisfy the thickness required for the spacer), for example, is prepared. A silicon dioxide film 61 of 1 μm thick, for example, is formed on the surface of the silicon single-crystal substrate 60 by thermal oxidation process. The 1 μm thick of the substrate is sufficient for the film 61 functioning as a protecting film against an anisotropic etching liquid (FIG. 9(*a*)).

A hydrogen fluoride protecting film 62 is formed on the obverse and the reverse side of the silicon single-crystal substrate 60 with the silicon dioxide film 61 formed thereon by a lithography method. The protecting film 62 formed on the substrate includes windows 63 and 64 corresponding to the path holes 5, 6, and 7, and if necessary, the indentations 50 (FIG. 9(*b*)).

In this state, the structure is etched using a hydrogen fluoride liquid, so that the portions of the silicon dioxide film 61 corresponding to the windows for the path holes 5, 6, and 7, and the indentations 50 are etched away (FIG. 9(*c*)). Patterns 61*a* and 61*b* of the silicon dioxide formed on the obverse and the reverse side of the substrate are somewhat different in size from each other so that the pattern 61*a* on the obverse side covers the pattern 61*b* on the reverse side, in this instance.

Following the step of forming the silicon dioxide patterns, the structure is etched in an aqueous solution of potassium hydroxide of approximately 17% in density, kept at a fixed temperature, for example, 80° C. In the etching process, only the portions of the silicon dioxide film corresponding to the windows 63 and 64 are etched away at the rate of 2 μm/min., with the patterns 61*a* and 61*b* of the silicon dioxide film as protecting films. In this case, the etching progresses from both sides of the substrate at an angle of approximately 35° to the surface of the substrate, viz., in the direction vertical to the crystallographic axis (111).

As described above, the patterns 61*a* and 61*b* formed on the obverse the and reverse side of the silicon single-crystal substrate 60 are formed so that the pattern 61*a* covers the pattern 61*b*. At the time of completing the etching process, a path hole 65 is formed which corresponds in size to the patterns 61*b* defining the larger window (FIG. 9(*d*)). Even if a slight misalignment of the patterns on the obverse and the reverse side of the substrate is caused, the etching size can be controlled through by adjusting the positions of the patterns defining the larger window since at least the edges of the patterns located outside are the etching surfaces.

Figure 10:
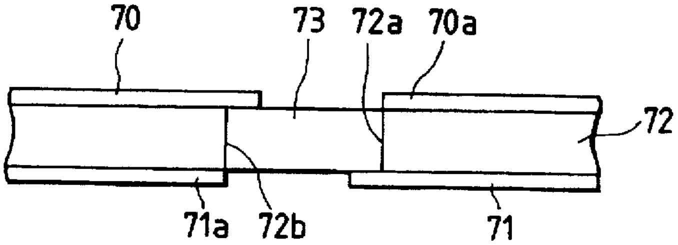
FIG. 10 is an explanation diagram for explaining a state of etching as the result of a misalignment of etching patterns formed on the obverse and the reverse side of the silicon single-crystal substrate, which are used for etching the surface of the substrate vertically oriented in (110) by anisotropic etching process.

Let us consider a case where patterns 70 and 71 of the same size are formed on the obverse and the reverse side of a substrate 72, as shown in FIG. 10. In this case, if these patterns are not aligned with each other, walls 72*a* and 72*b* are formed in line with the boundaries of the patterns 70*a* and 71*a* located outside a path hole 73 to be formed within the patterns oppositely formed on the obverse and the reverse side of the substrate. The size of the path hole 73 formed by this etching process is different from that of a path hole defined by the patterns 70 and 71. As a result, it is impossible to control the size of the path holes and the positions of the etching faces.

After the path hole 65 is formed, the silicon dioxide films 61*a* and 61*b* used as a mask are removed by using hydrogen fluoride. Thereafter, the structure is thermally oxidized to form a silicon dioxide film 66 of 1 μm thick, for example, (this figure indicates a film thickness satisfactory for the protecting film) over the entire exposed surface thereof. This silicon dioxide film 66 is used as a protecting film against ink (FIG. 9(*e*)).

Figure 11:
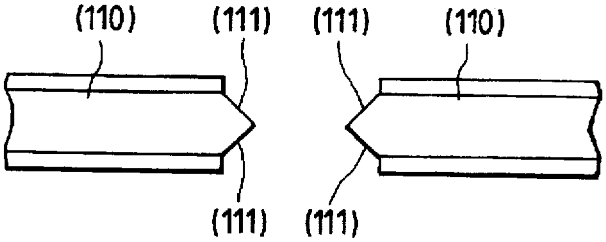
FIG. 11 is an explanatory diagram for explaining a progress of etching process when the silicon single-crystal substrate vertically oriented in (110) is etched by anisotropic etching process.
Figure 9A:
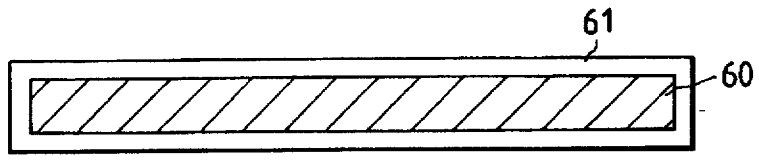
FIGS. 9(*a*) to (*e*) are diagrams showing a sequence of steps of manufacturing a spacer by processing a silicon single-crystal substrate vertically oriented in (110) by anisotropic etching process.
Figure 9B:
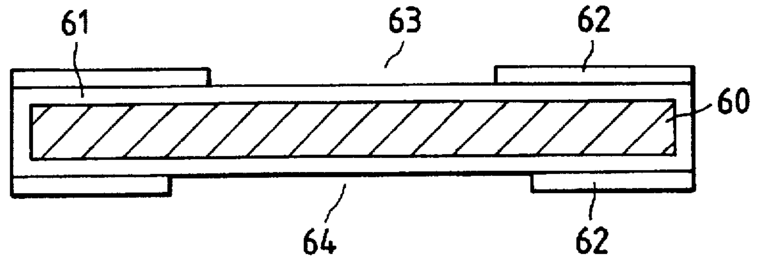
Figure 9C:
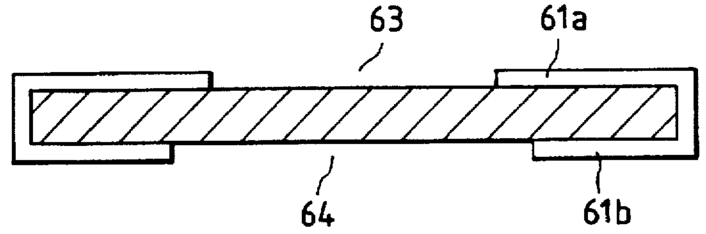
Figure 9D:
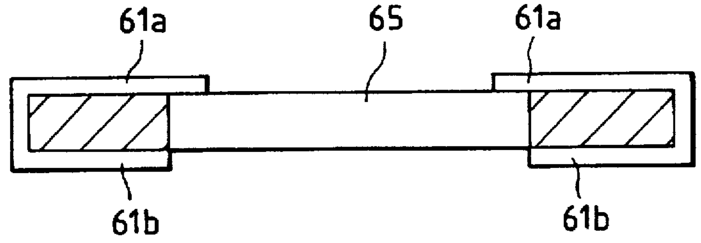
Figure 9E:
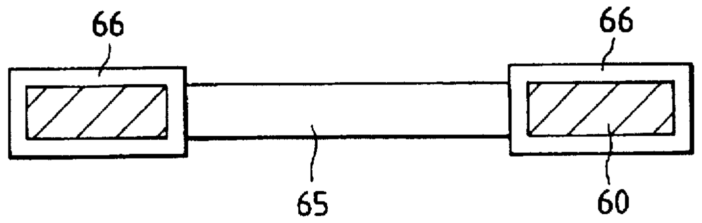
Figure 12A:
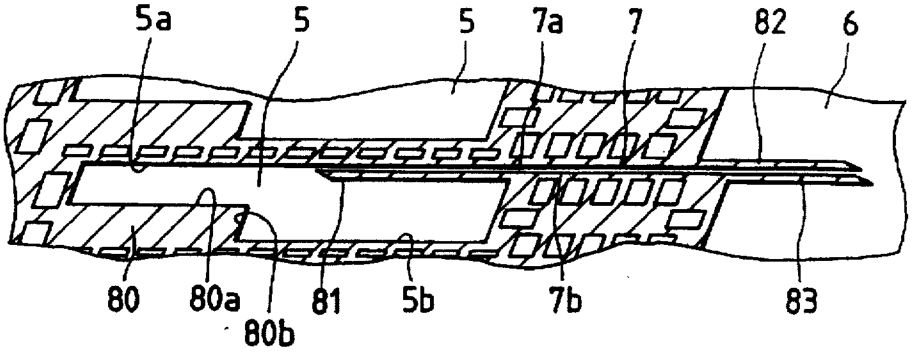
FIGS. 12(*a*) and 12(*b*) are diagrams showing an example of patterns to form a spacer by etching the silicon single-crystal substrate by anisotropic etching process, and a state of the structure immediately before the etching process ends.
Figure 12B:
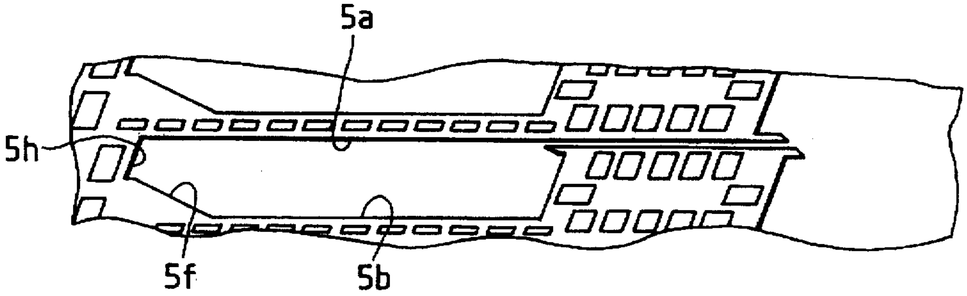

During the course of the anisotropic etching process of the silicon single-crystal substrate vertically oriented in (110)

till an intended pattern is formed, the etching progresses at an angle of approximately 35° to the face vertically oriented in (110), viz., along the face vertically oriented in (111) as shown in FIG. 11. In order to actively use this nature, as shown in FIG. 12(*a*), an approximately ½ region of the path hole 5 for the pressure generating chamber where it faces the nozzle opening is formed such that a boundary 80*a* of an etching pattern 80 defining the wall of the path hole is deviated toward the wall 5*a* thereof. A blade-like pattern 81, extended to the path hole 5, is formed on the wall 7*b* of the path hole 7 for the ink supply path. The wall 7*b* of the path hole 7 is opposed to the wall 7*a* thereof, which is in line with the wall 5*a* of the path hole 5. Further, blade-like patterns 82 and 83 are formed on the inner sides of the path hole 6 for the reservoir in a state that these patterns extend in line with the walls 7*a* and 7*b* of the ink supply path 7, respectively.

During the anisotropic etching process that is carried out using the etching patterns thus formed, in the stage of forming the path hole 5, the etching progresses on the edge 80*b* of the etching pattern 80 at a given angle to the wall 5*b* of the path hole because the etching pattern 80 includes the edge 80*b*. The etching progresses to reach the region facing the nozzle opening, so that the nozzle opening 2, and the walls 5*a*, 5*b*, 5*f*, and 5*g* facing the nozzle opening, which are arrayed at obtuse angles, are formed. At the junction part between the ink supply path and the pressure generating chamber and another junction part between the ink supply path and the reservoir, the etching is stopped when these junction parts are expanded to such an extent as to prevent ink from staying the inlet and outlet of the ink supply path as a narrow path for ink flow. With this, a fluid resistance proper for the ink supply path is secured.

In the stage of etching the path hole 7 for the ink supply path, the blade-like patterns 81, 82, and 83, the ends of which are extended from the walls, are first etched (FIG. 12(*b*)). Accordingly, in the final etching stage, viz., an etching stage where a through-hole is formed through the etching from both sides and intended patterns are formed, walls 5*d* and 5*e*, slanted at the angle $\theta1 \approx 30°$ to the walls 5*c* and 7*b*, are formed in the region or the junction part of the path hole 7 where it opens to the pressure generating chamber. Further, walls 6*b* and 6*c*, slanted at the angle $\theta2 \approx 70°$ to the walls 6*a* and 7*a*, are formed in the junction part of the path hole 7 where it opens to the reservoir. As a result, the inlet and the outlet of the ink supply path are expanded in diameter. With this expanded openings, ink smoothly flows into the pressure generating chamber, from the reservoir, without generating bubbles of ink.

Figure 13:
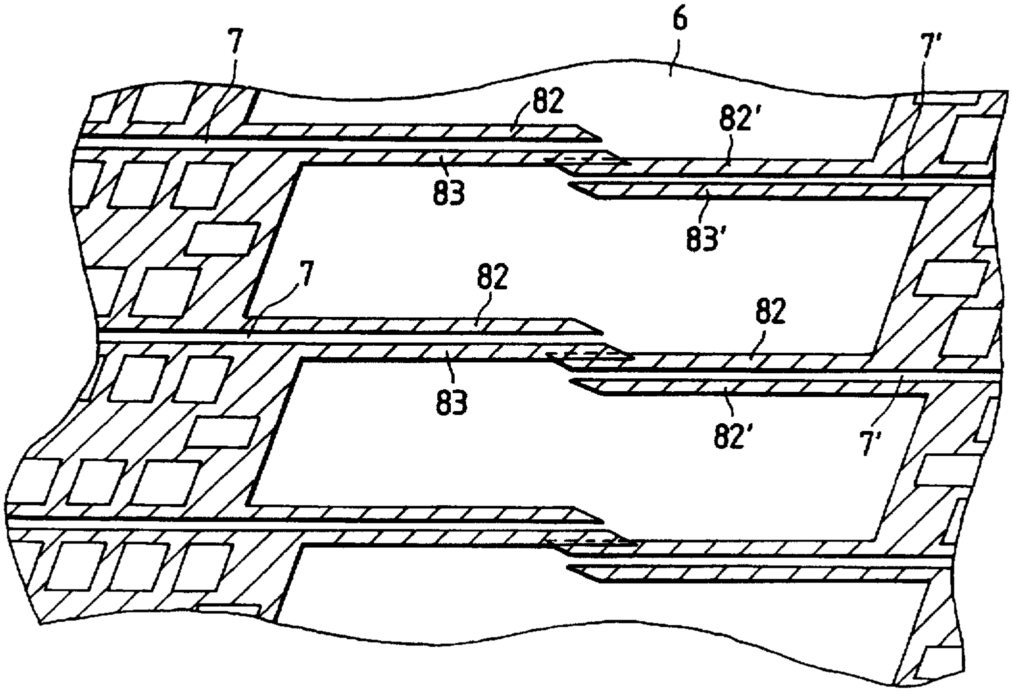
FIG. 13 is an enlarged, plan view showing etching patterns of the reservoirs in the structure for supplying ink from one reservoir to two pressure generating chambers.

FIG. 13 is an enlarged, plan view showing etching patterns of the reservoirs in the structure of the path holes 6 for the reservoirs, in which ink is supplied from one reservoir to two series of the pressure generating chambers. In this structure, the nozzles of the series of the pressure generating chambers are slightly dislocated from one another. Therefore, blade-like patterns 82, 83, 82', and 83', which are extended from the path holes 7 and 7' to server as ink supply paths to the pressure generating chambers, little lap.

Figure 14A:
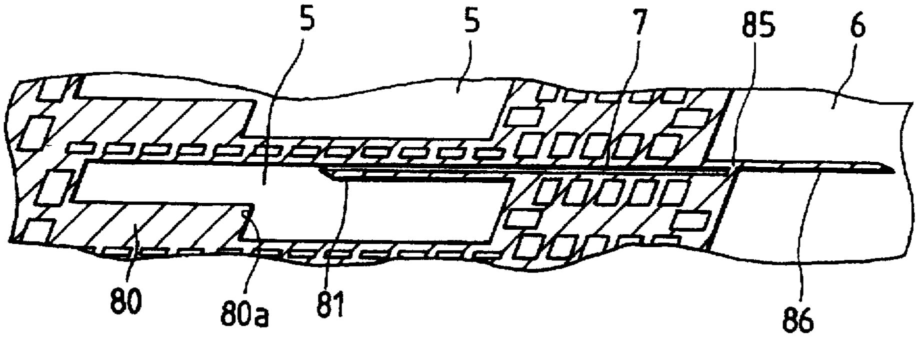
FIGS. 14*a* and 14*b* are diagrams showing another pattern for the anisotropic etching, the illustration showing a state of etching immediately before the etching ends.
Figure 14B:
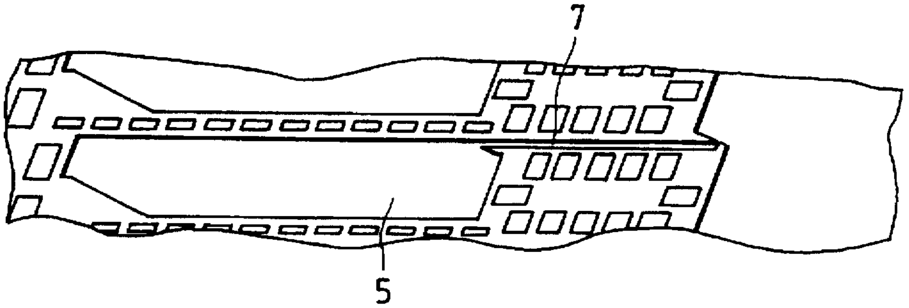

FIGS. 14*a* and 14*b* are diagrams showing another pattern for the anisotropic etching. In this pattern, a junction part of the path hole 7 to server as an ink supply path and a path holes 6 to serve as a reservoir is formed as a narrow continuous pattern 85. A single blade-like pattern 86 is extended in the axial direction of the path hole 7 to serve as the ink supply path.

In this pattern, the junction part of the ink supply path 7 and the path hole 6 for the reservoir is blocked by the narrow continuous pattern 85. Therefore, an unnecessary progression of the etching can be stopped by only one blade-like pattern 86.

Figure 15:
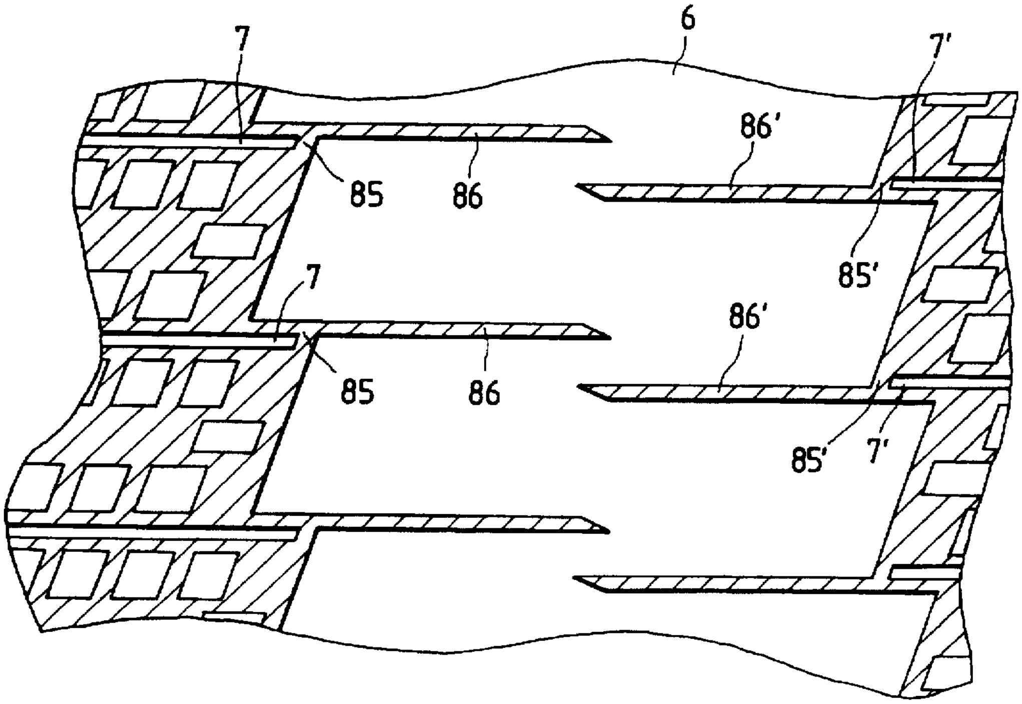
FIG. 15 is an enlarged, plan view showing another etching pattern containing reservoirs in such a structure for supplying ink from one reservoir to two series of pressure generating chambers.

In a case where ink is supplied from one reservoir to two series of the pressure generating chambers as in FIG. 13, the object can be achieved by forming narrow continuous patterns 85 and 85' near to the ends of the path holes 7 and 7' for the ink supply paths and forming blade-like patterns 86 and 86' extending from the narrow continuous patterns in alignment with the path holes 7 and 7', as shown in FIG. 15. Therefore, if these are displaced from the nozzle positions of the nozzle series, the blade-like patterns 86 and 86' may be laid out in a plane without lapping them.

Figure 16:
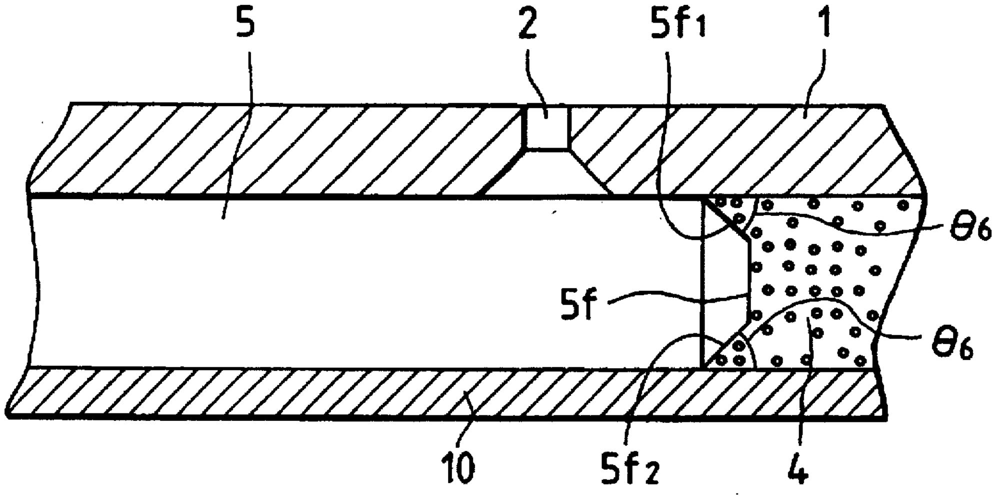
FIG. 16 is an enlarged, cross sectional view showing a portion of the path hole forming the pressure generating chamber in the vicinity of the nozzle opening.
Figure 17:
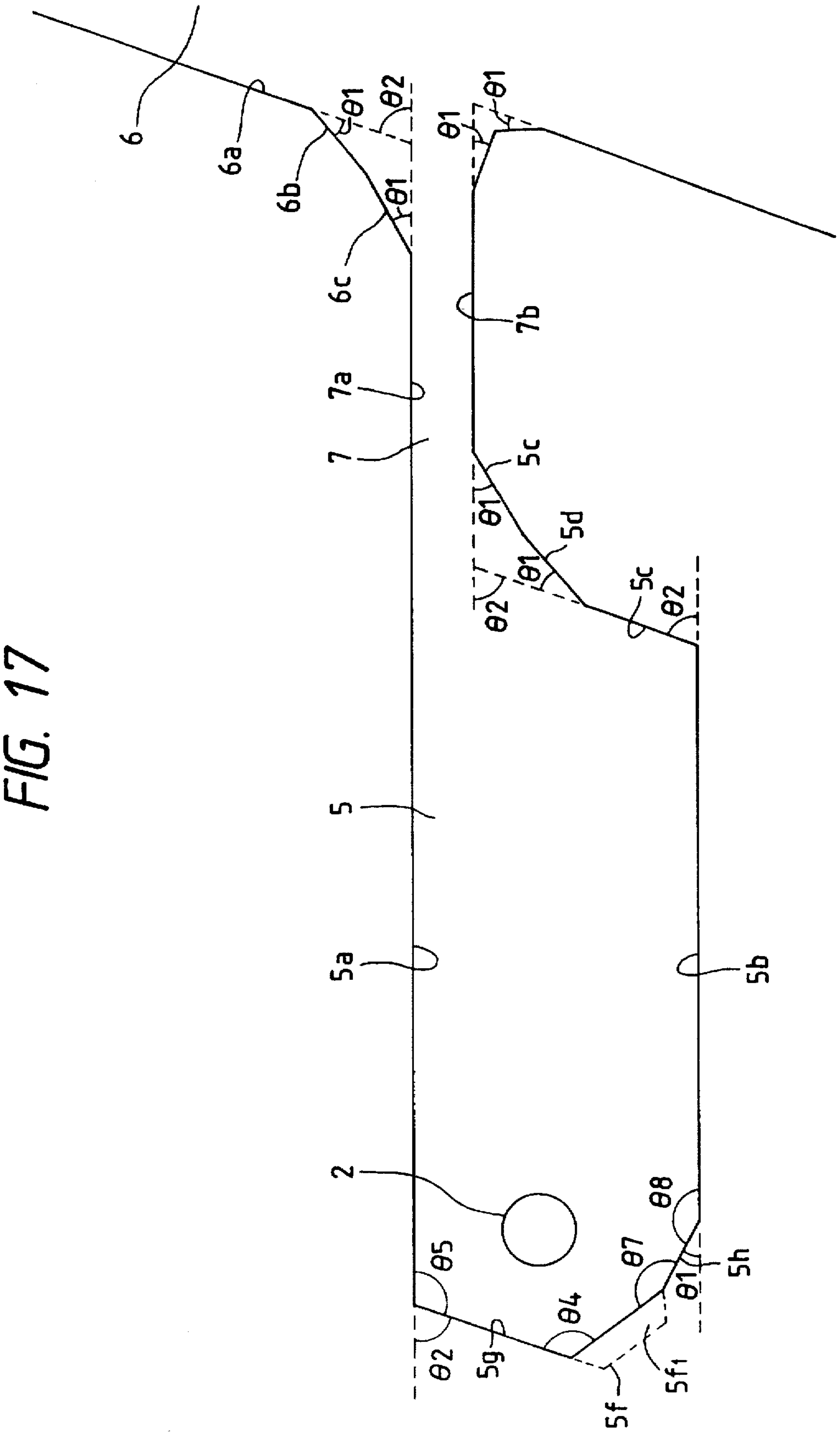
FIG. 17 is a view showing another path hole forming the pressure generating chamber.

In the above-mentioned embodiment, the etching process is stopped when the wall 5*f* comes in contact with the wall 5*g*. However, if the etching process is further continued, two walls 5*f*1 and 5*f*2 are additionally formed on the wall 5*f*, and the wall 5*f* is incurved in shape, as shown in FIG. 16. As a result, an additional wall 5*h* is grown, which is slanted at an angle $\theta8 = 152°$ to the wall 5*b* defining the pressure generating chamber 48, as shown in FIG. 17. An angle $\theta7$ is approximately 125°. An angle $\theta6$ of the wall 5*f*1 (wall 5*f*2) to the surface of the spacer 4 is approximately 35°.

As the result of the etching process, a total of seven walls are formed around the nozzle opening 2. These walls are five walls 5*a*, 5*g*, 5*f*, 5*h*, and 5*b* arranged at obtuse angles in plan and standing up at a right angle to the surface of the silicon single-crystal substrate, and two walls 5*f*1 and 5*f*2 connecting to the wall 5*f* at the angle 86 as viewed in the cross sectional direction of the silicon single-crystal substrate. With this structure, a more smoothly flow of ink is secured in the vicinity of the nozzle opening 2. Accordingly, stay of bubbles never happens.

Figure 18:
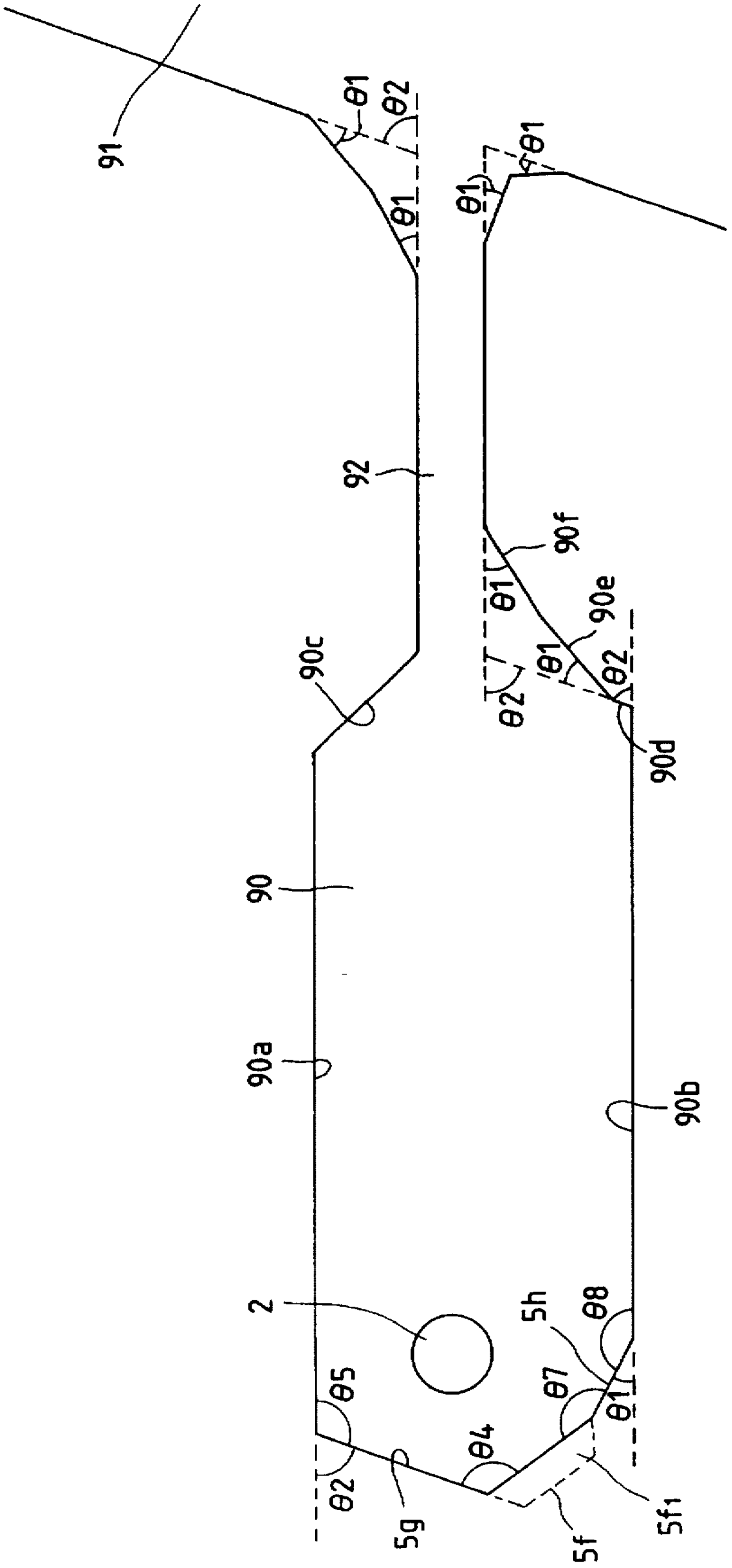
FIG. 18 is a view showing yet another path hole forming the pressure generating chamber.

As in the embodiment where the four walls are formed around the nozzle opening 2, a path hole 92 for an ink supply path, which connects a path hole 90 for a pressure generating chamber to a path hole 91 for a reservoir, may be formed such that walls 90*c* and 90*d* are formed which are obliquely extended from the longitudinal walls 90*a* and 90*b* defining the pressure generating chamber, and the path hole 92 is located substantially in alignment with the center line of the pressure generating chamber (FIG. 18). With this structure, ink is supplied from the reservoir to the pressure generating chamber by way of an outlet of the ink supply path, which is defined by the walls 90*c* and 90*d* outwardly expanded from the locations near to the center of the end of the chamber toward the pressure generating chamber, and walls 90*e* and 90*f* secondarily formed along the crystal axis during the etching process. Ink flows from the reservoir to the pressure generating chamber more smoothly, without any stay of ink bubbles.

Figure 20:
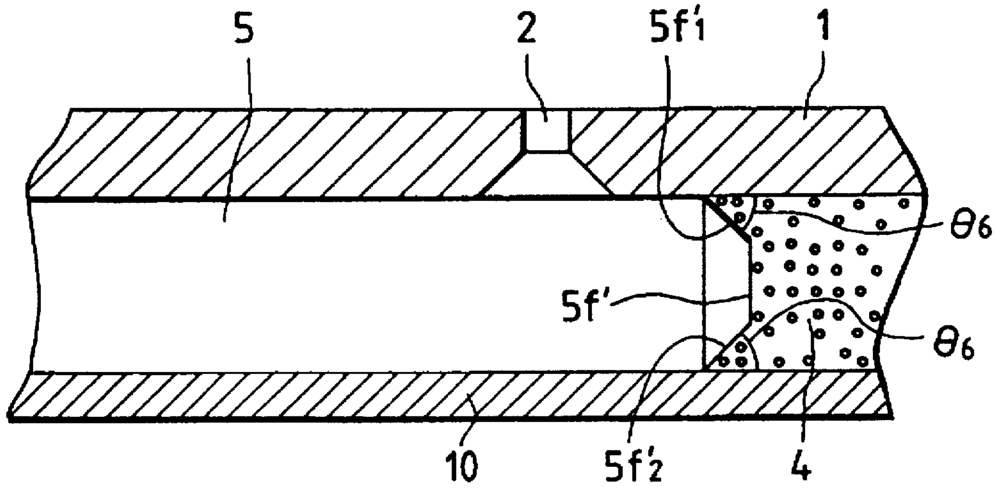
FIG. 20 is an enlarged, cross sectional view showing a portion of the path hole forming the pressure generating chamber in the vicinity of the nozzle opening.
Figure 19:
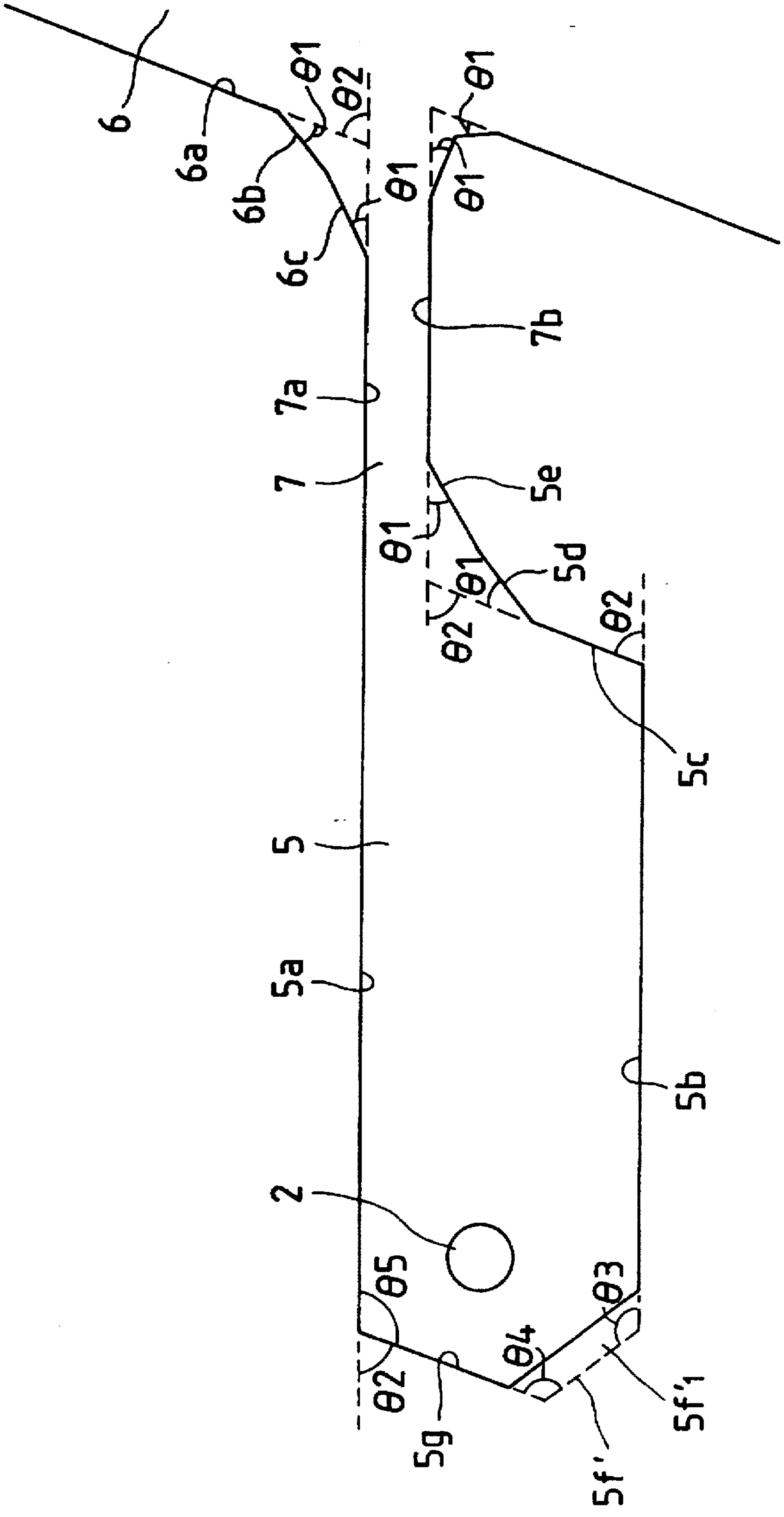
FIG. 19 is a view showing still another path hole forming the pressure generating chamber.

After the wall 5*h* is formed, the etching process is further continued. Then, the etching of the wall 5*f* selectively progresses. The end of the wall 5*f* closer to the wall 5*b* grows, so that the wall 5*g* formed in the previous step disappears. As a result, as shown in FIGS. 19 and 20, six walls 5*a*, 5*g*, 5*f*, 5*f*1', 5*f*2', and 5*b*, which are arranged at obtuse angles in plan and standing up at a right angle to the surface of the silicon single-crystal substrate, are formed around the nozzle opening 2. Ink smoothly flows in the vicinity of the nozzle opening 2, and ink bubbles never stay there.

Figure 21:
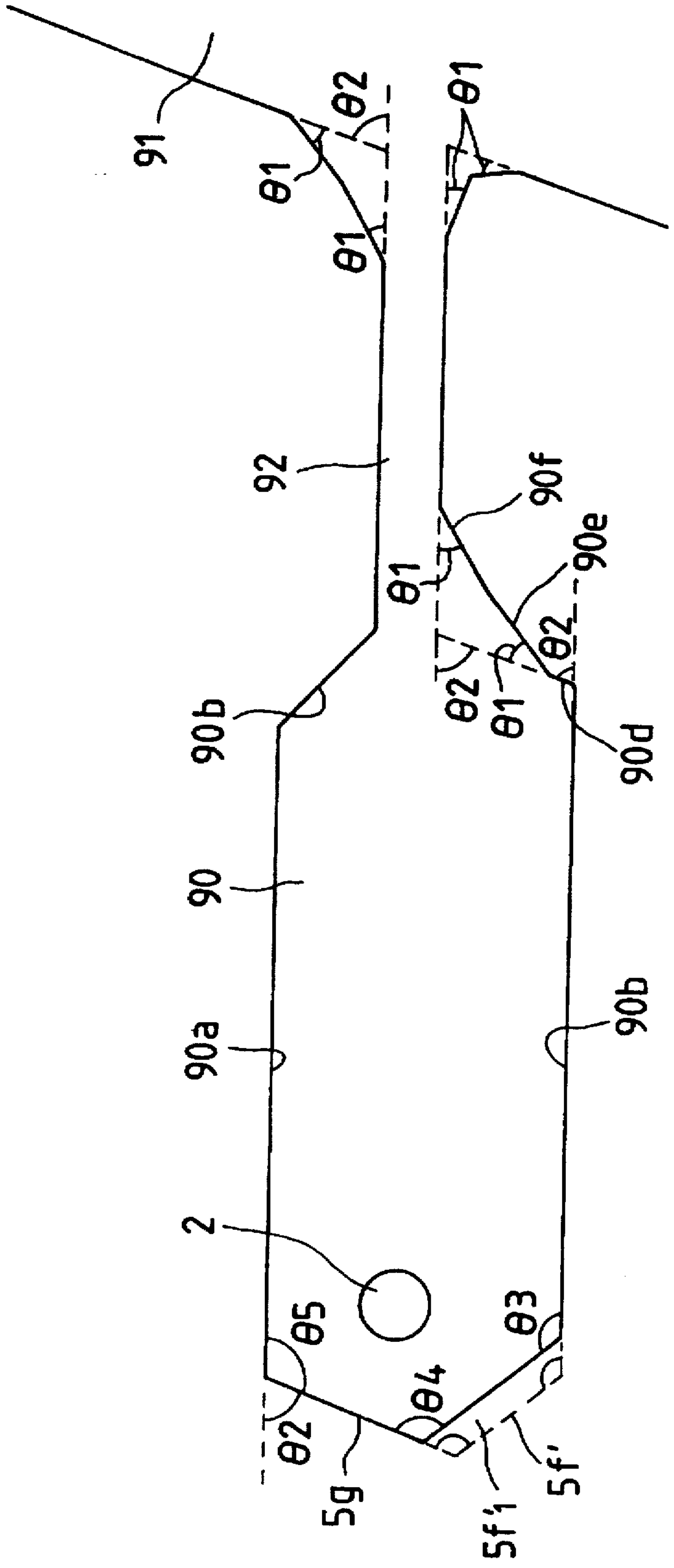
FIG. 21 is a view showing a further path hole forming the pressure generating chamber.

As in the previous case, a path hole 92 for an ink supply path, which connects a path hole 90 for a pressure generating chamber to a path hole 91 for a reservoir, may be formed such that walls 90*c* and 90*d* are formed which are obliquely extended from the longitudinal walls 90*a* and 90*b* defining the pressure generating chamber, and the path hole 92 is located substantially in alignment with the center line of the pressure generating chamber (FIG. 21). With this structure, ink is supplied from the reservoir to the pressure generating chamber by way of an outlet of the ink supply path, which is defined by the walls 90*c* and 90*d* outwardly expanded from the locations near to the center of the end of the chamber toward the pressure generating chamber, and walls 90*e* and 90*f* secondarily formed along the crystal axis during the etching process. Ink flows from the reservoir to the pressure generating chamber more smoothly, without any stay of ink bubbles.

The above-mentioned spacer has such a structure that the path holes 5 for the pressure generating chambers, the path holes 7 for the ink supply paths 7, and-the path holes 6 for the reservoirs are formed in the thin silicon single-crystal substrate of approximately 220 μm thick. In this structure, the substrate is segmented at locations near the path holes for the pressure generating chambers. Accordingly, the upper side of the substrate is easily slid against the lower side thereof and vice versa. With this structure, when the spacer is inserted between the nozzle plate 1 and the vibrator plate 10, and those members are bonded together, those path holes 5 and 7 are frequently deformed. In other words, the walls defining the pressure generating chambers are extended in a cantilever fashion. When the spacer is bonded to other related members, the walls are easily bent. If the walls are bent, the path holes 7 for the ink supply paths are deformed.

Figure 22A:
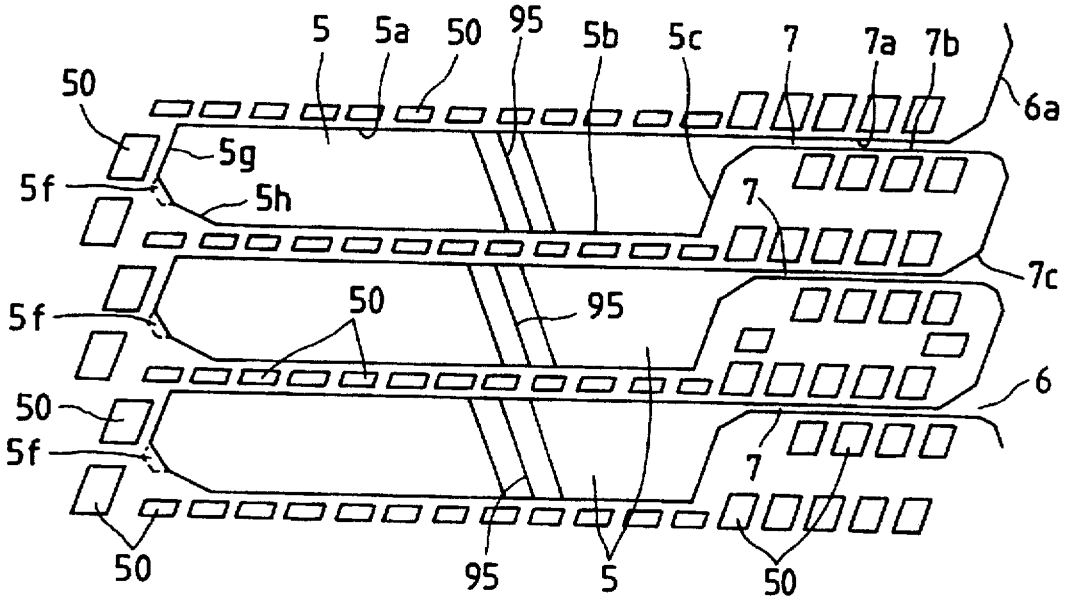
FIG. 22*a* is a plan view showing the structure of another spacer.
Figure 22B:
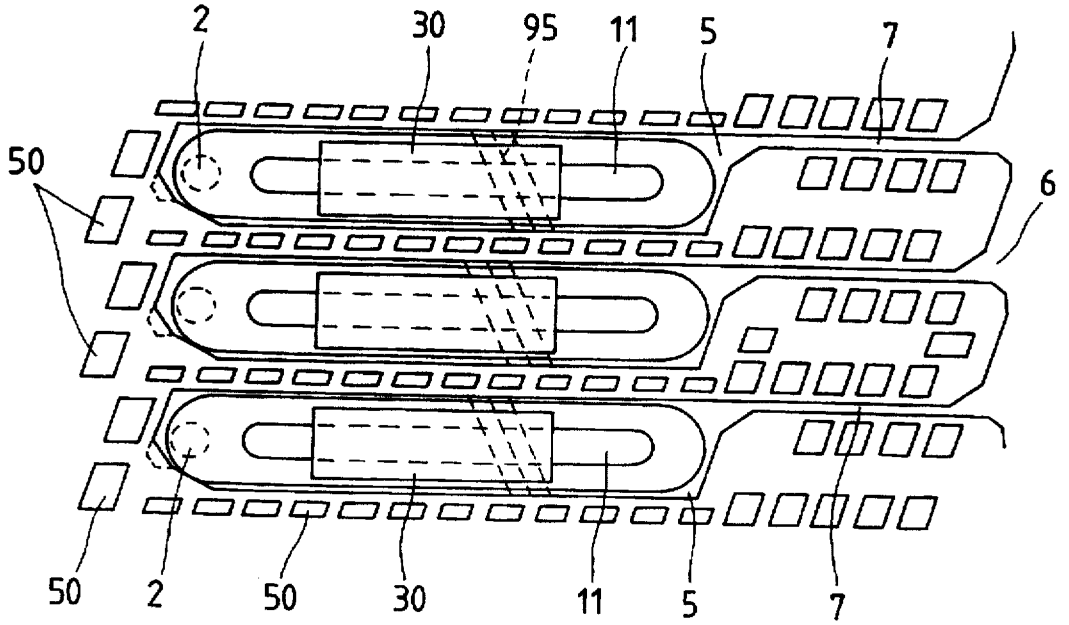
FIG. 22*b* is a plan view showing a positional relationship of the nozzle openings, islands, and piezoelectric vibrating elements when the nozzle plate, the vibrator plate, and the piezoelectric vibrating elements are mounted on the spacer.
Figure 23:
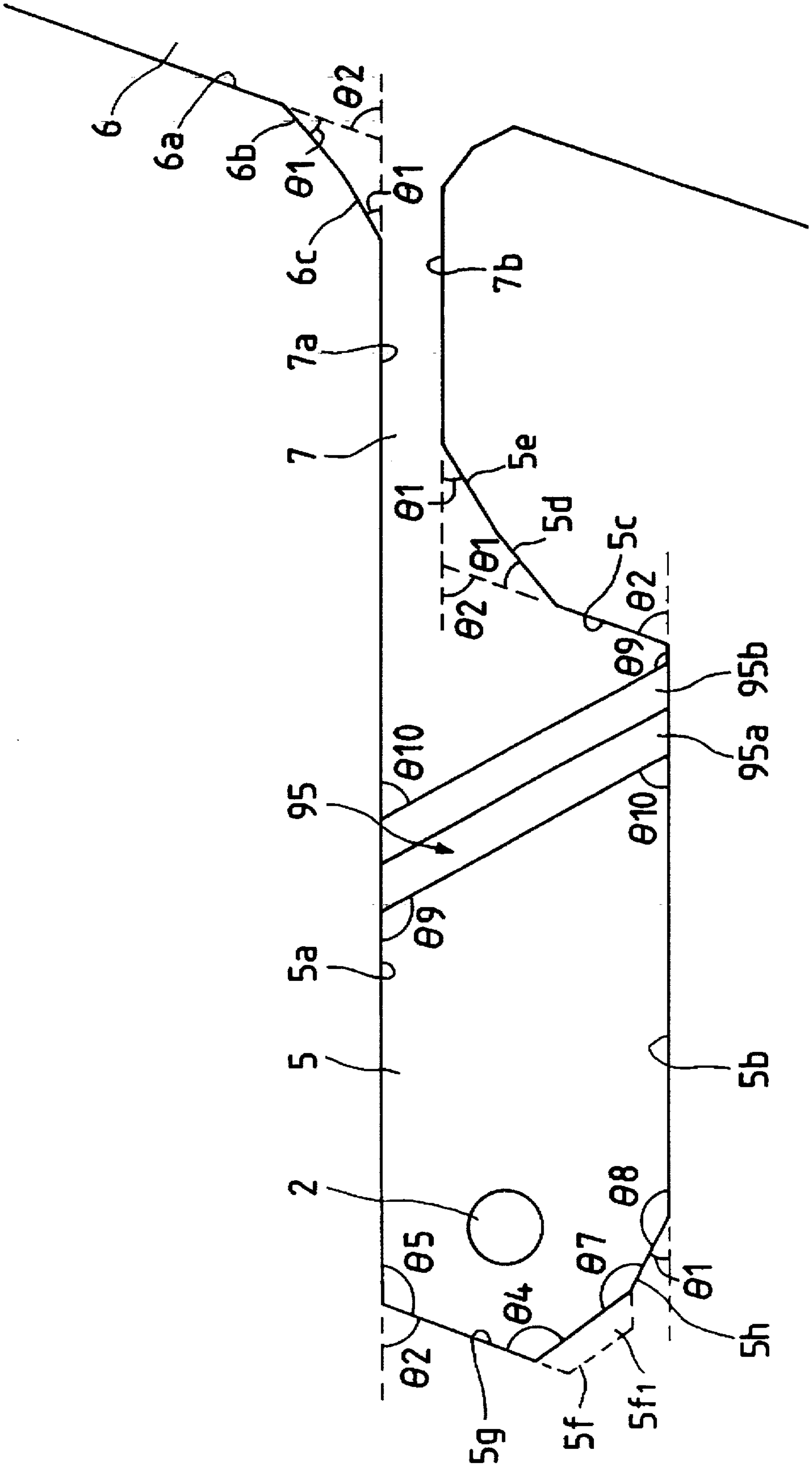
FIG. 23 is a view showing an additional path hole forming the pressure generating chamber.

FIG. 22*a* is a plan view showing the structure of a spacer which withstands the deformation of the path holes for the pressure generating chamber 48 and the path holes 7 for the ink supply paths. This undeformable structure is applied for the above-mentioned spacer structure of the type in which seven walls are formed around the nozzle opening 2. FIG. 22*b* is a plan view showing relative positions of the pressure generating chamber 48, the nozzle opening 2, and piezoelectric vibrating elements 30 of the spacer. FIG. 23 is an enlarged view showing the configuration of a path hole forming the pressure generating chamber and its related portions. As shown, a path hole 5 forming a pressure generating chamber 48, a path hole 6 forming a reservoir, and a path hole 7 forming an ink supply path are formed in a silicon single-crystal substrate vertically oriented in (110), the thickness of which is sufficient for the spacer, e.g., 220 μm. A bridge 95 is obliquely formed across the path hole 5 at a location closer to the path hole 7.

Figure 24:
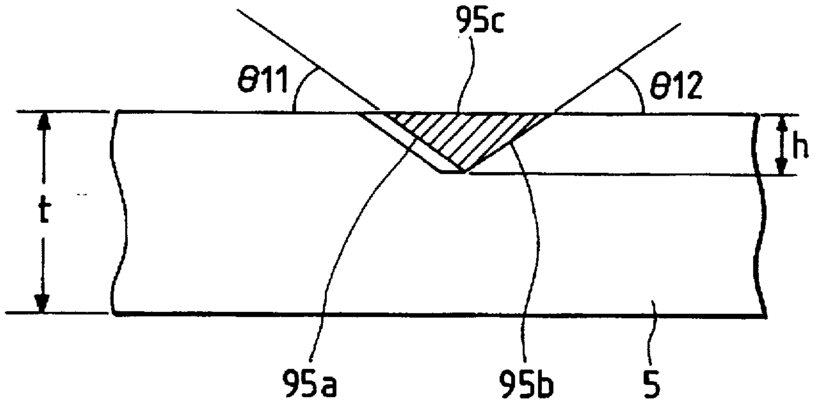
FIG. 24 is a cross sectional view showing the cross sectional shape of the bridge.

The bridge 95 formed across the path hole is slanted at angles $\theta 9=126°$ and $\theta 10=55°$ to the walls of the path hole 5, which define the pressure generating chamber. The cross sectional structure of the bridge 95 is shown in FIG. 24. As shown, it is a triangle of which the bottom 95*c* lies on the side of the substrate to be in contact with the nozzle plate. A slanting surface 95*a* of the bridge 95 is slanted so as to increase the cross section of the pressure generating chamber toward the nozzle opening 2, and at an angle $\theta$11 (about 35°) to the surface of the nozzle plate.

Another slanting surface 95*b* is slanted toward the ink supply path 7 at an angle $\theta$12 (approximately 35°) to the nozzle plate.

The angle of the bridge 95 at its vertex is an obtuse angle, approximately 110°. Therefore, the bridge 95 causes no vortex of ink in the pressure generating chamber, and hence does not impede the flow of ink therein. The height h of the bridge 95 is selected to be such a value as not to impede the flow of ink and as to secure a satisfactory strength of the bridge. The height of the bridge is preferably 25% of the thickness t of the spacer.

Figure 25:
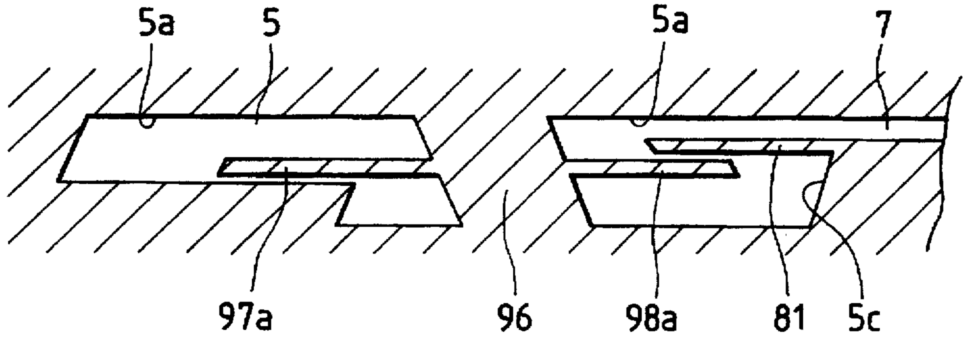
FIGS. 25 and 26 are views of exemplary etching patterns formed on the obverse and the reverse side of the silicon single-crystal substrate to form the path holes.
Figure 26:
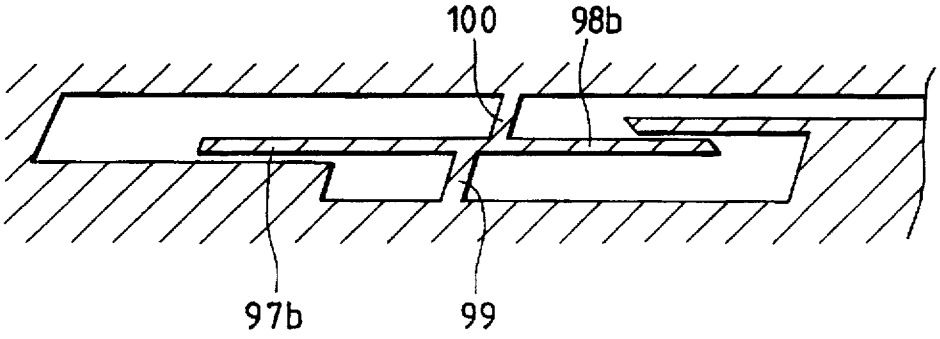
Figure 27A:
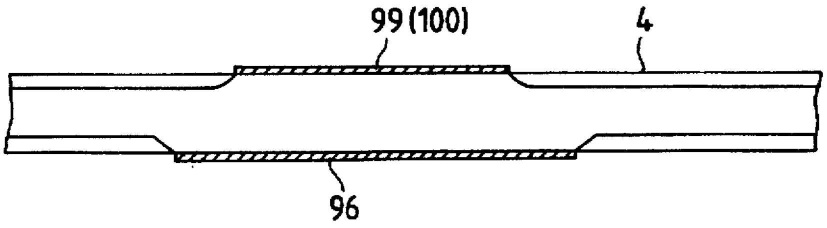
FIGS. 27(*a*) to (*d*) and 28(*a*) to (*d*) are a cross sectional view and a plan view showing a progressive state of the etching that is carried out using the above etching patterns.
Figure 27B:
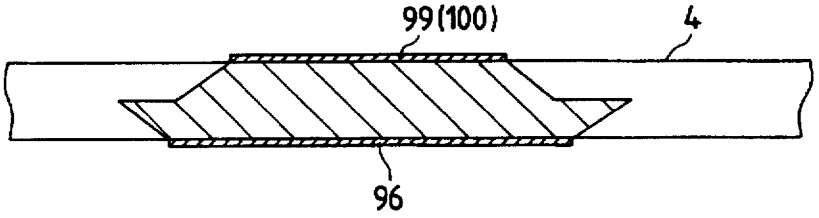
Figure 27C:
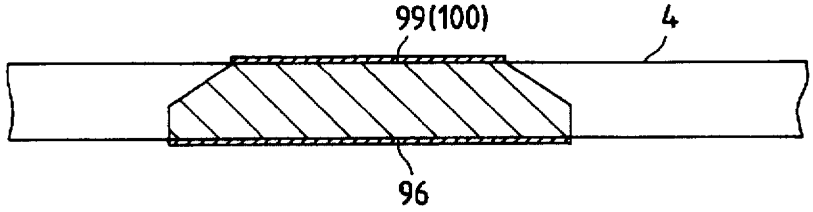
Figure 27D:
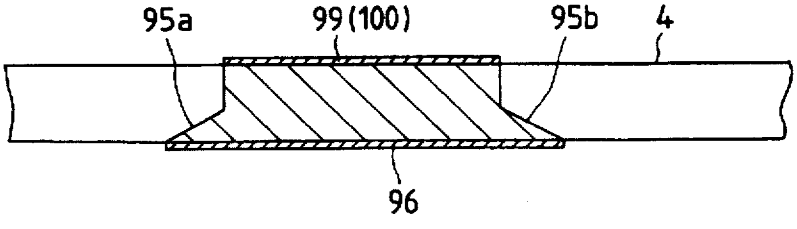

FIGS. 25 and 26 are views showing etching patterns suitable for forming the pressure generating chambers with the bridges 95. An etching protecting pattern 96 defining the bottom 95*c* of the bridge 95 is formed in a location (facing the nozzle opening of the path hole 5) on the etching pattern 80 defining the whole pressure generating chamber. In the portion to serve as a slanting side thereof facing the vibrator plate 10, patterns 99 and 100, which are relatively narrow when compared with the etching protecting pattern 96, are formed in the locations near to the center line of the etching pattern 95. These narrow patterns 99 and 100 are not aligned with each other.

An etching protecting pattern 97*a*, shaped like a blade, is extended on one of the boundaries of the etching protecting pattern 96 in parallel with the wall 5*a* of the path hole 5 for the pressure generating chamber. An etching protecting pattern 98*a*, shaped like a blade, is extended from the wall 5*c* of the path hole 5 toward the path hole 5. The wall 5*c* faces the wall 7*a* of the path hole 7 in line with the wall 5*a* of the path hole 5 for the pressure generating chamber (the wall 7*a* is one of the walls defining the path hole 7 for the ink supply path). A straight pattern, connected at the central part thereof to the patterns 99 and 100, is horizontally extended. The left side of the straight pattern is designated by reference numeral 97*b*, while the right side thereof, by numeral 98*b*. These narrow patterns 97*b* and 98*b*, which serve as etching protecting patterns, are located corresponding to the narrow etching protecting patterns 97*a* and 98*a*.

The silicon single-crystal substrate vertically oriented in (110) with the etching protecting patterns thus formed is etched by the anisotropic etching method. The etching progresses along the (111) face slanted at an angle of approximately 35° to the obverse and the reverse side of the silicon single-crystal substrate, as described above (FIG. 27(*a*)). In a stage where the etching, which starts from the obverse and the reverse side of the substrate, progresses into the substrate, viz., the etching depth reaches about the half of the thickness of the substrate (FIG. 27(*b*)), the edge 80*b* of the etching pattern 80 grows in the direction substantially vertical to the (110) face of the silicon single-crystal substrate (FIG. 27(*c*)).

Thus, the etching vertically progresses up to the end of the etching protecting pattern 96 on the nozzle plate side. In other words, the etching progresses so that the surface of the substrate is left at the angle of about 35°, and progresses till it intersects the etching patterns 99 and 100 on the vibrator plate side (FIGS. 27(*d*) and 28(*a*)). In FIG. 28, each arrow indicates an inclination of the left surface. Specifically, the left surface is inclined in the direction indicated by the arrow head.

For the regions covered with the etching protecting patterns 97*a*, 98*a*, 97*b*, and 98*b*, the etching progresses in the direction substantially vertical to the obverse and the reverse side of the silicon single-crystal substrate so as to shorten the regions. With these patterns, the etching reaches the boundary of the etching protecting pattern 96. Then, the etching progresses so that the surface slanted at the angle of 35° to the surface of the silicon single-crystal substrate is left, as in the previous case (FIG. 28(*b*)). The etching reaches the narrow etching protecting patterns 99 and 100, and further progresses. Then, the etching protecting pattern is bifurcated into two patterns. With the bifurcation, the etching advances toward the walls 5*a* and 5*b*, while the etching advances in the same direction as that of the etching protecting patterns 97*a*, 97*b*, 98*a*, and 98*b* (FIG. 28(*c*)).

As recalled, the narrow etching protecting patterns 99 and 100, which form the ridge of the bridge triangular in cross section, are not aligned with each other. Accordingly, an edge part where the (111) faces intersect is formed, thereby preventing the formation of a vertical wall.

If the etching protecting patterns 99 and 100 are aligned with each other, a wall of which the crystal face of (111) is vertical which resembles in shape the etching protecting patterns 99 and 100 is formed. This wall segments the pressure generating chamber into two sections.

After the etching protecting patterns 99 and 100, which are formed on the vibrator plate side, disappear, the etching is further continued. Then, a bridge 95 is formed in which the slanting surfaces 95*a* and 95*b* of the (111) faces, slanted at about 35°, intersect when viewed in cross section.

If the etching process is further continued, the ridge of the bridge is etched to be flat. However, the etching process is stopped when the regions around the nozzle opening and the ink supply path are shaped as intended. Accordingly, the etching protecting patterns 96, 99, and 100 are determined by the timing of the stop of the etching process.

In the above instance, the bridge 95 is formed across the path hole 5 to be the pressure generating chamber 48. If required, it may be formed across the path hole 7 to be the ink supply path, as shown in FIG. 29. As shown, a bridge 102 triangular in cross section is formed across the path hole 7. A method similar to that used for forming the bridge 95 may be used for forming the bridge 102.

Also in this instance of the embodiment, the walls 7*a* and 7*b* of the path hole 7 are supported by the bridge 102. Because of this structure, the width size of the path hole 5 and the path hole 7 can be maintained throughout the assembling stage.

Figure 30B:
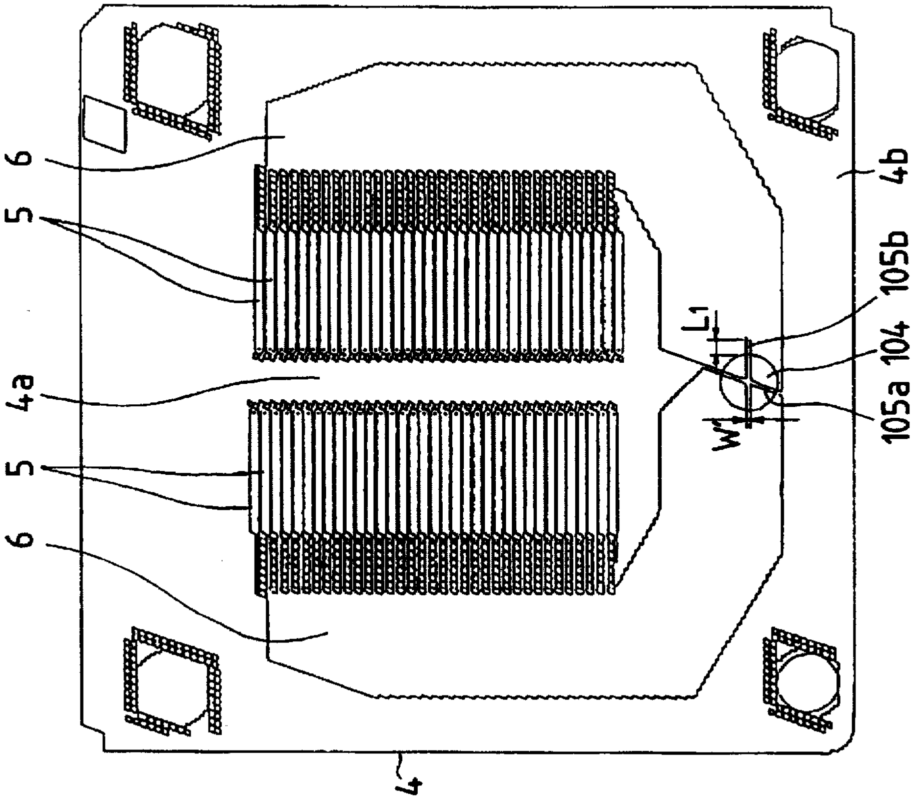
FIGS. 30*a* and 30*b* are plan views showing other spacers used for the ink jet printer head according to the present invention.
Figure 30A:
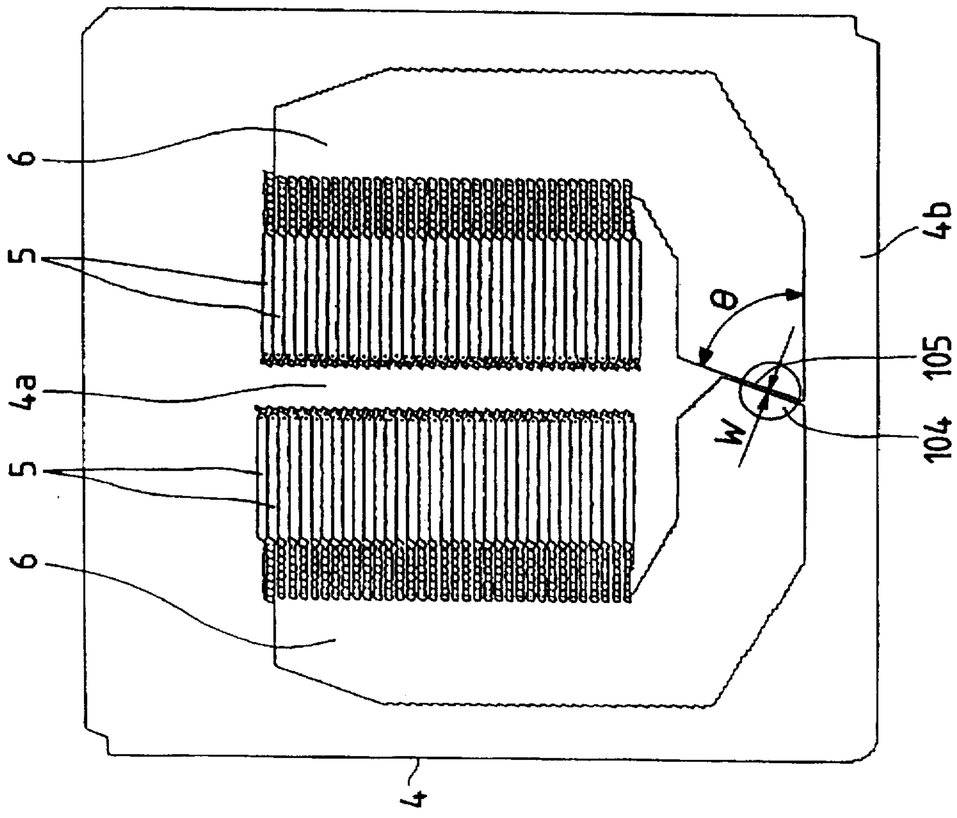

The spacer 4 made of the silicon single-crystal substrate is very thin, approximately 220 μm thick. Because of this, the mechanical strength of the spacer, particularly a specific region of the spacer, is weak. The spacer 4 contains large spaces, such as pressure generating chambers 48 and the reservoirs. In this sense, the spacer 4 consists of a main area 4*a* and a peripheral area 4*b* (FIG. 30). The main area 4*a* includes a plural number of the path holes 5 for the pressure generating chambers 48. The peripheral area 4*b* includes a plural number of the path holes 6 for the reservoirs in association with the path holes 5. In each of these large spaces, the major surfaces of the large space, or the upper or the lower sides, which define the large space, are supported in a cantilever fashion. Therefore, a boundary region between the main area 4*a* and the peripheral area 4*b* is mechanically fragile.

To cope with this, the present embodiment uses reinforcing means for reinforcing this fragile region. The reinforcing means is realized in the form of a partition wall 105 formed between the main area 4*a* and the peripheral area 4*b* in the vicinity of the ink supply path 104, which receives ink from an external ink tank (FIG. 30(*a*). The partition wall 105 is slanted at an angle θ (70.5°) with respect to the vertical line in the drawing. The partition wall 105 may be formed in a previous manner.

The partition wall 105 is bridged between the walls of the path holes 6 or the ink supply path 104, while traversing the ink supply path 104. It is obstructive in the flow of ink from the ink tank to the reservoir. Therefore, after an old ink cartridge is exchanged with a new one, the problem of a defective ink discharge may arise highly possibly. However, this problem can be solved by properly selecting the width W of the partition wall 105 as seen from a graph of FIG. 31 showing a curve representative of defective-discharge occurrence rate vs. the width of the partition wall.

Figure 31:
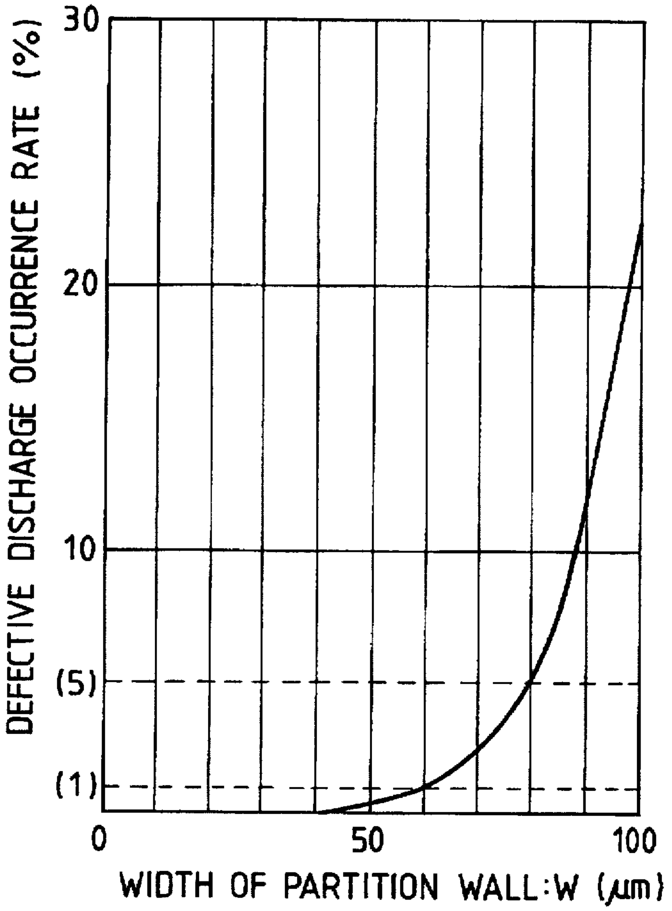
FIG. 31 is a graph showing a curve representative of defective-discharge occurrence rate vs. the width w of the partition wall.

As seen from FIG. 31, the defective-discharge occurrence rate abruptly increases when the width W of the partition wall 105 exceeds 80 μm. For the spacer of 180 to 200 μm, if the width W of the partition wall 105 is selected to be approximately 20 μm, a satisfactory mechanical strength of the boundary region of the spacer can be secured and the defective-discharge problem can be solved.

Accordingly, it is suggestible to select the width W of the partition wall 105 to be within 20 to 80 μm.

The reinforcing means may be modified as shown in FIG. 30(*b*). In the modification, another partition wall 105*b* crosses the partition wall 105 (denoted as 105*a* in this instance) at the central part of the ink supply path 104. This modified reinforcing means prevents poor bonding that is possibly caused by a bending of the vibrator plate 10 in a part thereof near the ink supply path 104 when the nozzle plate 1, the spacer 4, and the vibrator plate 10 are assembled and bonded together, and are fastened to the print head body 42. Accordingly, no ink is leaked into the piezoelectric vibrating members 32, and a normal operation of the piezoelectric vibrating members 32 is ensured. The partition wall 105*b* includes the surfaces in parallel with the walls 5*a* and 5*b* of the path hole 5. The width W' of the partition wall 105*b* is selected to preferably be 20 to 80 μm, as seen from FIG. 31. The length L1 of the partition wall 105*b* where it is connected to the vibrator plate 10 is preferably the thickness of the spacer 4 or larger.

More than three partition walls may be formed in consideration of the defective-discharge problem, and others.

Figure 33:
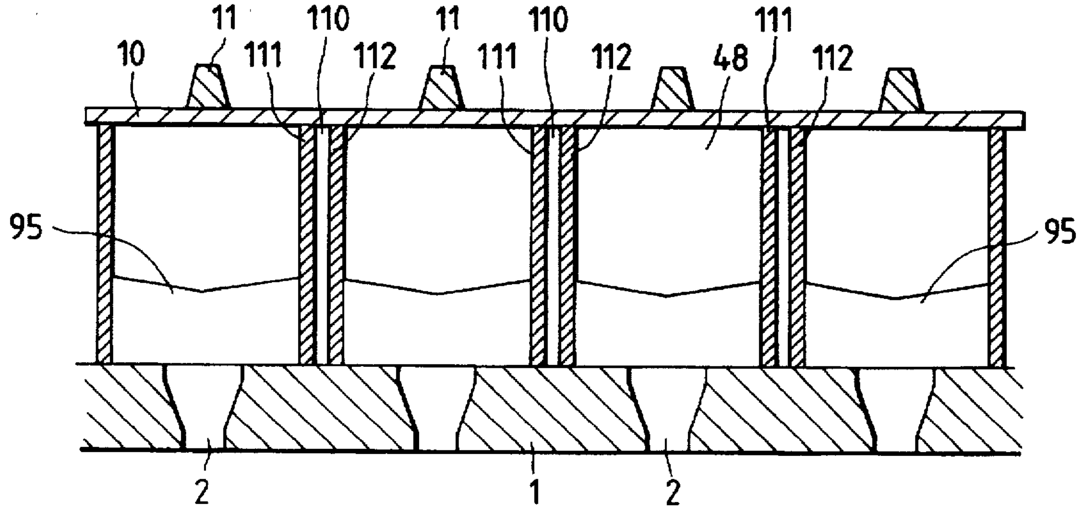
FIG. 33 is a cross sectional view showing the nozzle plate, the pressure generating chambers, and the vibrator plate near the bridge and the nozzle openings.
Figure 32:
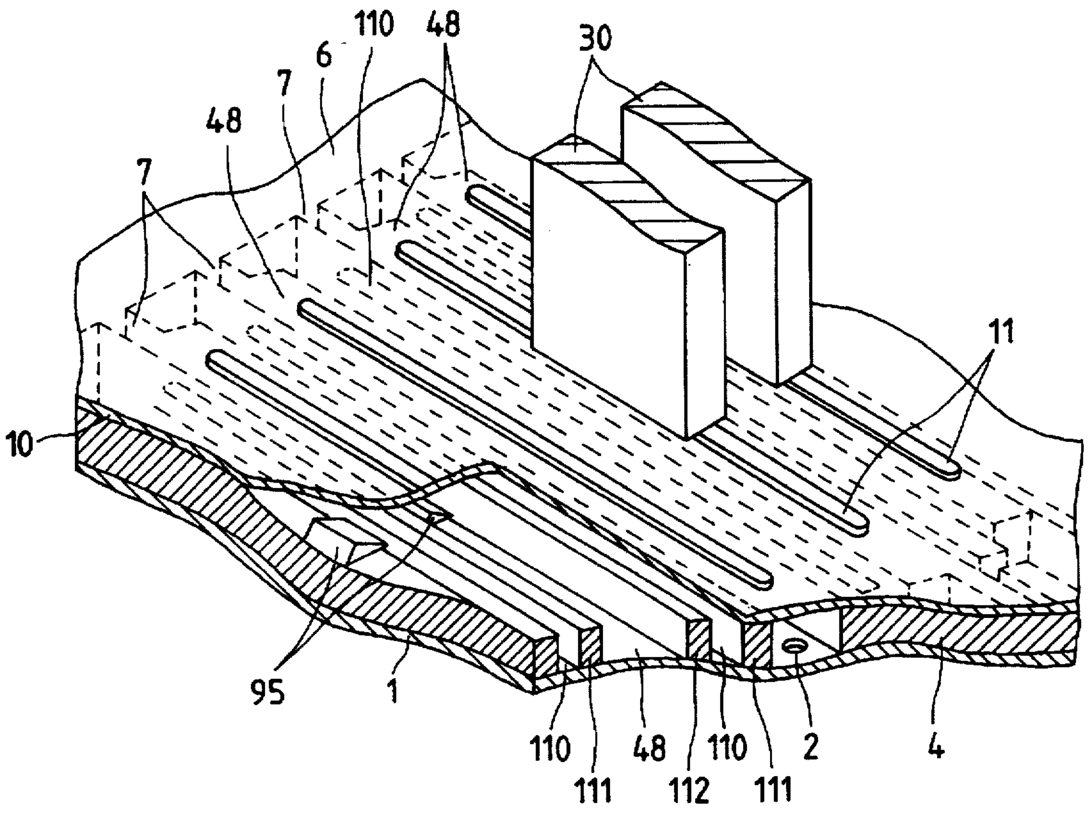
FIG. 32 is a perspective view, partly in cross section, showing another embodiment of an ink jet printer head according to the present invention.
Figure 35:
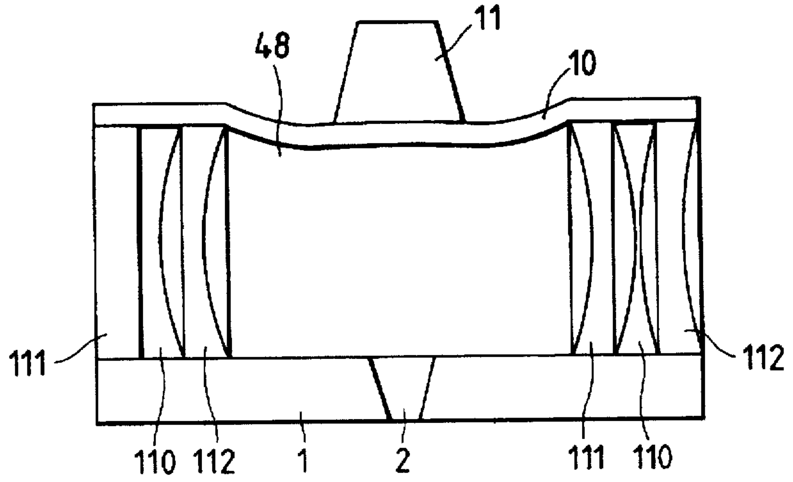
FIG. 35 is a diagram schematically showing the structure including a pressure generating chamber, the illustration showing deformation of the chamber partitioning walls when a pressure is applied to the chamber.

An ink jet printer head according to a second embodiment of the present invention will be described with reference to FIGS. 32 and 33. As shown, in the ink jet printer head, pressure generating chambers 48 are partitioned by unique chamber partitioning means. The chamber partitioning means consists of a narrow space 110 defined by a couple of very thin partition walls 111 and 112.

Figure 34A:
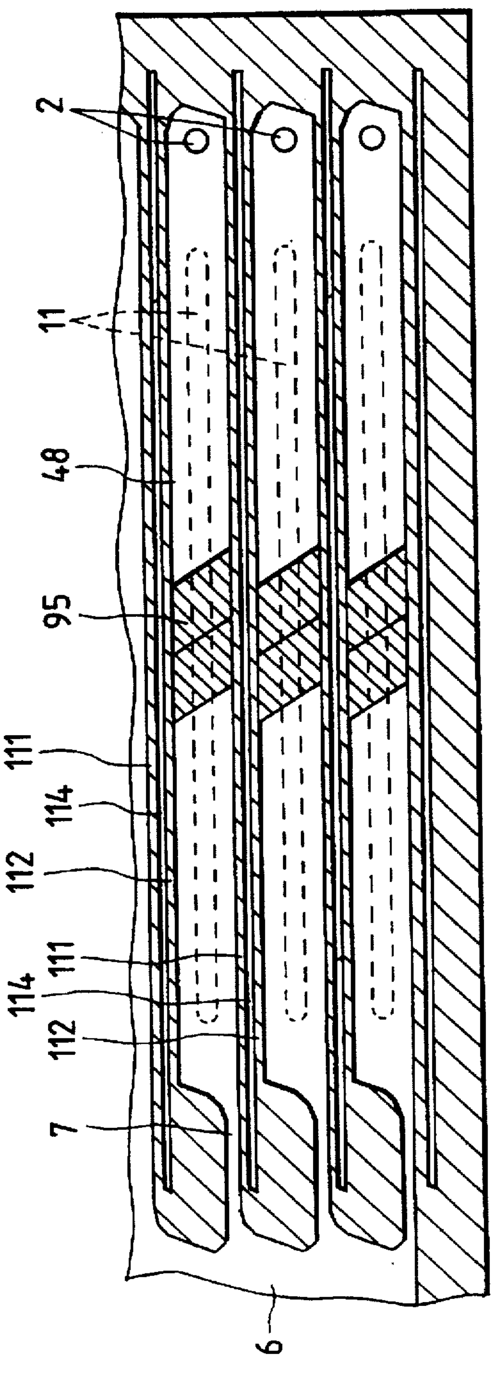
FIGS. 34*a* and 34*b* are a plan view and a cross sectional view showing an exemplar spacer.
Figure 34B:
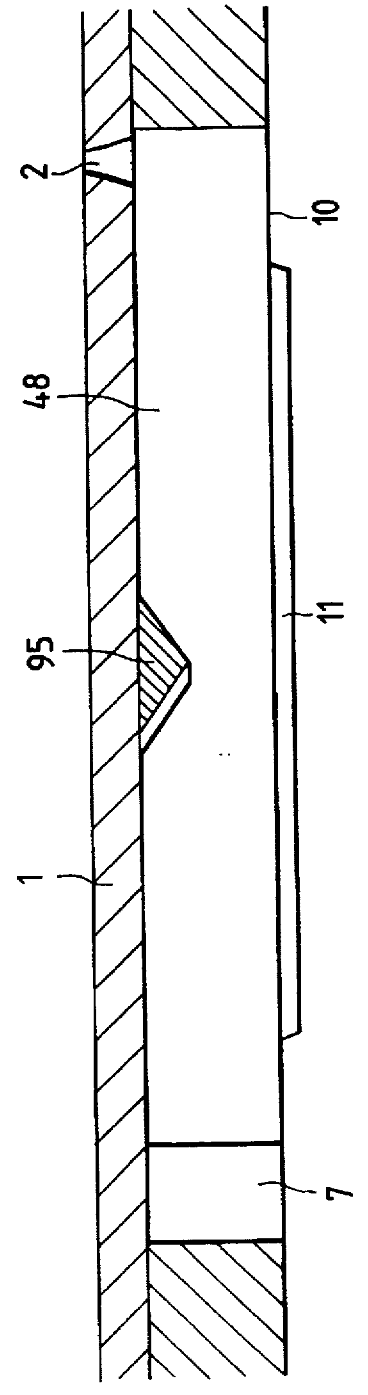

A spacer used for the ink jet printer head is illustrated in FIGS. 34*a* and 34*b*. As shown, the narrow spaces 110 partitioning the pressure generating chambers 48 takes the form of slits 114. Each slit 114 is extended from the ink supply path 7 to a location beyond the nozzle opening 2. In the embodiment, the partition walls 111 and 112 of the chamber partitioning means are 15 μm. The partition walls 111 and 112 have such a thickness as to allow these walls to be resiliently deformable when the walls receive a pressure caused when a pressure is applied to ink for ink discharge. A slanted bridge 95, triangular in cross section, traverses each pressure generating chamber 48 in a state that it connects the partition walls 111 and 112 of the adjacent chamber partitioning means, as shown. The bridge 95 is located at the central part of each pressure generating chamber 48 when viewed in the longitudinal direction of the chamber.

The bridge 95 is located on the side of the spacer 4, closer to the nozzle plate 1, and spaced from the vibrator plate 10 a fixed distance. Provision of the bridge 95 is not obstructive in the flow of ink within the pressure generating chamber 48. The thickness of the bridge 95 is selected to such an extent as to prevent the partition walls 111 and 112 from falling toward the narrow space 110 or the pressure generating chamber 48. In this embodiment, the height from the base of the triangle (of the cross section of the bridge 95) to the vertex is approximately 70 μm.

In the ink jet printer head thus constructed, the piezoelectric vibrating elements 30, which vibrate in a longitudinal vibration mode, are fastened at the first ends of the pressure generating chambers 48 and attached at the second ends thereof to the islands 11 of the vibrator plate 10. Drive signals based on print data are applied to the print head. In response to the drive signals, the piezoelectric vibrating elements 30 longitudinally expand to compress the pressure generating chambers 48 to cause pressure in the chambers.

The pressure generated expands the pressure generating chamber 48, thereby bending the partition walls 111 and 112 toward the narrow spaces 110 and the vibrator plate 10 outward, and causing ink to shoot forth through the nozzle opening 2.

The narrow spaces 110 of the chamber partitioning means, which partition the pressure generating chambers 48, absorb the deformation of the partition walls 111 and 112 defining the narrow spaces 110, thereby blocking the transfer of the displacement of the partition walls 111 and 112 to the adjacent pressure generating chambers 48. Provision of the narrow spaces 110 effectively prevents the cross talk.

Figure 36A:
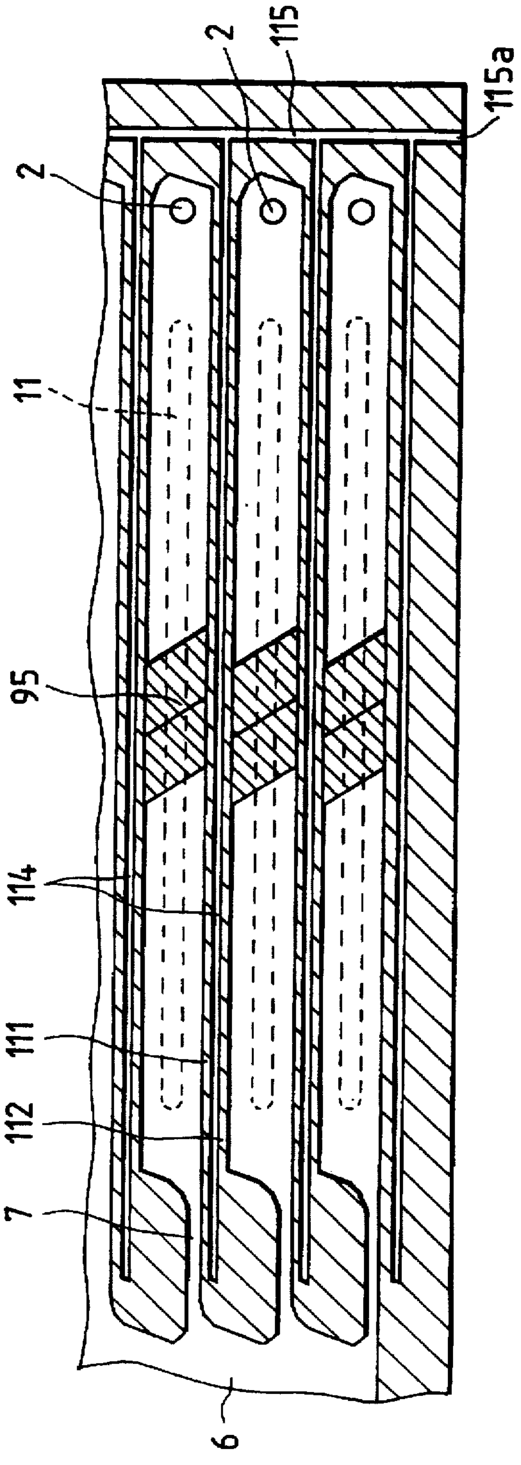
FIGS. 36*a* and 36*b* are a plan view and a cross sectional view showing another spacer.
Figure 36B:
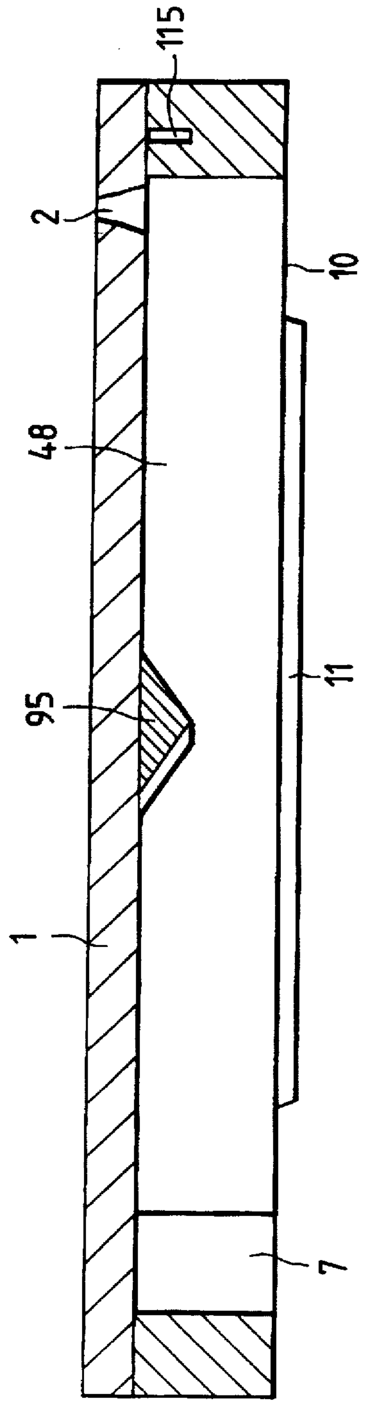

In FIGS. 36*a* and 36*b*, there is shown another spacer adaptable for the second embodiment of the ink jet printer head. As shown, in this spacer, a second slit 115 is formed which extends in the direction of the array of the nozzle openings 2. The second slit 115 is continuous to the slits 114 as the narrow spaces 110 and opened at the opening 115*a* to the air.

With this structure, the narrow spaces 110 are not closed by the nozzle plate 1 and the vibrator plate 10. Accordingly, the partition walls 111 and 112 are undeformable under ambient temperature variation.

In this instance of the embodiment, the narrow spaces 110 defined by the partition walls 111 and 112 are connected to the second slit 115 located at one end of the spacer 4. If required, these narrow spaces 110 or the slits 114 may directly be opened to the air at both ends of the spacer individually.

Figure 37A:
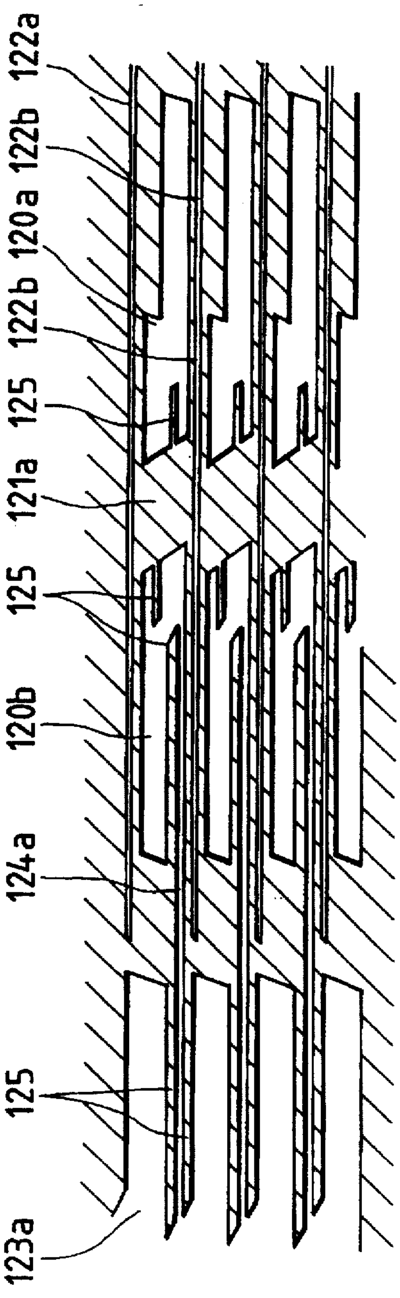
FIGS. 37*a* and 37*b* are plan views showing patterns formed on the obverse and the reverse sides of a spacer formed of a silicon single-crystal substrate when the spacer is processed by anisotropic etching process.
Figure 37B:
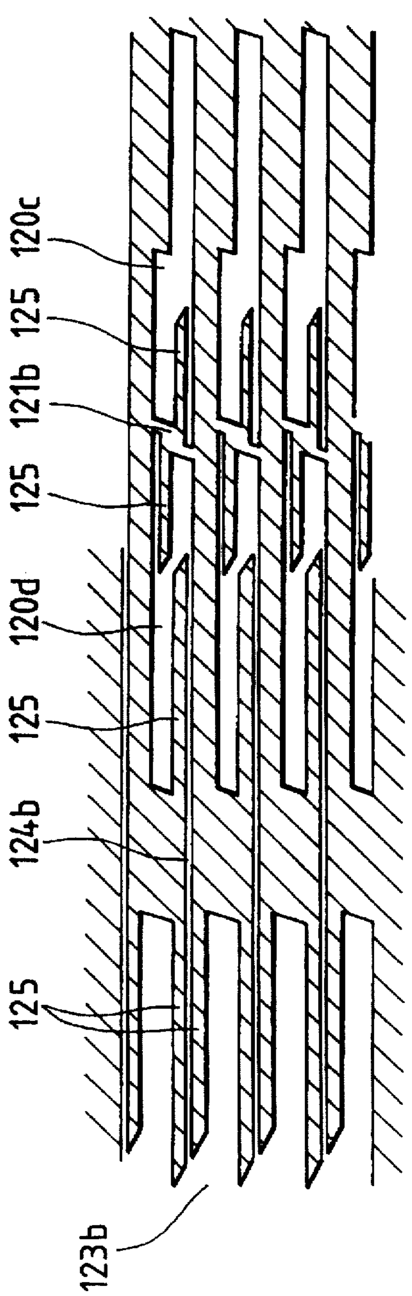
Figure 38A:
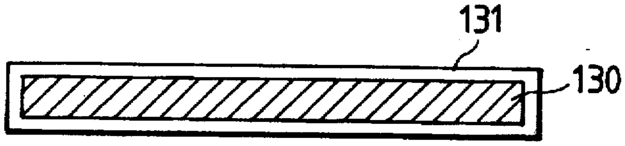
FIGS. 38(*a*) and (*f*) are views showing a sequence of steps for forming a spacer by anisotropic etching process.
Figure 38B:
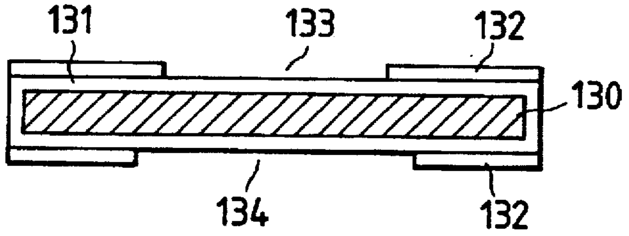
Figure 38C:
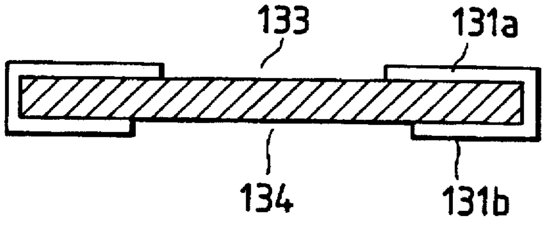
Figure 38D:
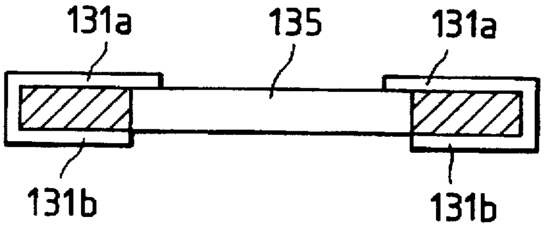
Figure 38E:
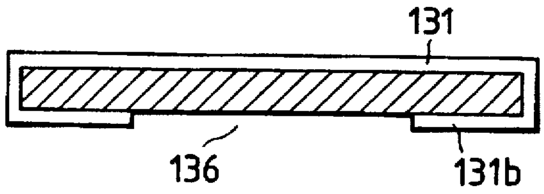
Figure 38F:
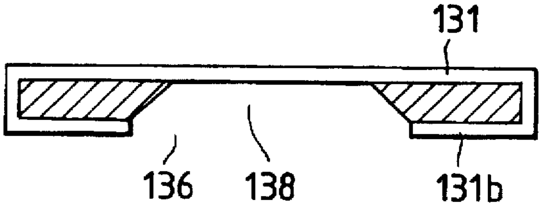

FIGS. 37*a* and 37*b* are plan views showing etching patterns for manufacturing the spacer 4 structured as mentioned above by etching a silicon single-crystal substrate of the crystallographic axis (110) by an anisotropic etching method. FIG. 37*a* shows an etching pattern on the side of the silicon single-crystal substrate on which the bridge 95 is formed, and FIG. 37*b* shows an etching pattern on the side thereof on which a space is provided above the bridge 95 so as to secure the free flow of ink in the pressure generating chamber 48. In FIGS. 37*a* and 37*b*, the hatched areas indicate etching protecting films.

In FIG. 37*a*, reference numerals 120*a* and 120*b* indicate windows for defining etching areas to secure spaces for the pressure generating chambers 48 on one side of the silicon single-crystal substrate. In FIG. 37*b*, reference numerals 120*c* and 120*d* also indicate windows for defining etching areas to secure spaces for the pressure generating chambers 48 on the other side of the silicon single-crystal substrate. A protecting film 121*a* for protecting an area corresponding to the bridge 95 against the etching is formed between the windows 120*a* and 120*b*. A small protecting film 121*b* for resisting the etching to a certain degree is formed in the etching pattern on the other side of the silicon single-crystal substrate.

Narrow windows 122*a* and 122*b* are formed in the etching pattern on the nozzle opening side of the silicon single-crystal substrate (FIG. 37*a*). The narrow windows 122*a* and 122*b* ranges between the windows 120*a* and 120*b* for forming the slits 114 each defined by the partition walls 111 and 112.

Windows 123*a* and 123*b* for the path holes 6 of the reservoirs are formed closer to the ink supply paths to the pressure generating chambers. The windows 123*a* and 123*b* are connected to the windows 120*b* and 120*d* for forming the pressure generating chambers 48 by narrow windows 124*a* and 124*b*, respectively. These narrow windows 124*a* and 124*b* are for etching the path holes 7 for the ink supply paths. Etching protecting patterns 125 are used for checking the progress of an excessive etching into relatively narrow spaces, which is caused by the edging effect in the anisotropic etching process.

Of those windows 120*a* to 120*d* for the pressure generating chambers, the windows 120*a* and 120*b* on one side of the silicon single-crystal substrate (FIG. 37*a*) are larger than the windows 120*c* and 120*d* on the other side (FIG. 37*b*) or vice versa. The same thing is correspondingly applied to the windows 124*a* and 124*b*.

More specifically, the windows 120*a*, 120*b*, and 124*a* on one side of the substrate are about 5 μm larger than those corresponding windows 120*c*, 120*d*, and 124*b* on the other side thereof so that the former windows can cover the latter ones when those windows are erroneously positioned in the stage of printing the etching patterns.

An anisotropic etching process will be described.

A silicon single-crystal substrate 130 of the crystallographic axis (110), 220 μm thick (enough to satisfy the thickness required for the spacer), for example, is prepared. A silicon dioxide film 131 of 1 μm thick, for example, is formed on the entire surface of the silicon single-crystal substrate 130 by thermal oxidation process. The 1 μm thick of the film 131 is sufficient for the film 131 functioning as a protecting film against an anisotropic etching liquid (FIG. 38(*a*)).

Photo-setting photosensitive layers are formed on the silicon dioxide film 131 on the obverse and the reverse side of the silicon single-crystal substrate 130. After the patterns (FIG. 37*a*) are positioned on one side of the substrate and the patterns (FIG. 37*c*) are positioned on the other side thereof, then the structure is exposed to light. Thereafter, the structure is immersed into photolithography liquid. The exposed areas, i.e., the areas in which path holes are to be formed, on the substrate are dissolved to form the windows 133 and 134 since those areas are not hardened (FIG. 38(*b*)).

In this state, the Structure is etched using hydrogen fluoride liquid. The silicon dioxide films 131 within the windows 133 and 134 are removed.

As described above, the silicon dioxide pattern 131*a* formed on one side of the substrate covers the silicon dioxide pattern 131*b* on the other side thereof (FIG. 38(*c*)).

The structure is etched in an aqueous solution of potassium hydroxide of approximately 17% in density, kept at a fixed temperature, for example, 80° C. In the etching process, only the portions of the silicon dioxide film corresponding to the windows 133 and 134 are etched away at the rate of 2 μm/min., with the patterns 131*a* and 131*b* of the silicon dioxide film as protecting films. In this case, the etching progresses from both sides of the substrate at an angle of approximately 35° to the surface of the substrate, viz., in the direction vertical to the crystallographic axis (111).

The patterns 131*a* and 131*b* formed on the obverse and the reverse side of the silicon single-crystal substrate 130 are sized such that one pattern covers the other patter, viz., the boundary of the etching protecting pattern defining a position of the wall is positioned at a location outside the boundary of the etching protecting pattern that is located against the former etching protecting pattern in a mirror image fashion. Accordingly, at the completion of the etching process, the wall of a formed path hole 135 is defined by the pattern 131*b* of which the boundary is positioned outside (FIG. 38(*d*)).

For this reason, even if the alignment of the patterns on the obverse and the reverse side of the substrate is not exact, the etching is carried out while being defined by the larger window 134.

When anisotropic etching process is carried out using a pattern with only one window 136 (FIG. 38(*e*)), the etching progresses along a specific crystal axis. As a result, the etching progresses while being defined by the window 136, thereby to form a concavity 138 trapezoidal in cross section on the window-formed side of the structure (FIG. 38(*f*)).

Figure 39A:
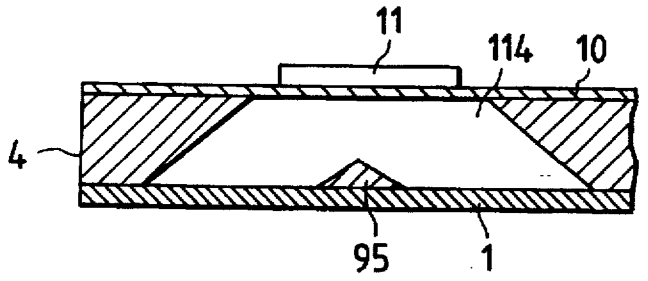
FIGS. 39*a* and 39*b* are cross sectional views showing slits formed by anisotropic etching process when viewed in the longitudinal direction of the pressure generating chamber.

When slits are thus formed by anisotropic etching process using the window 136 that is formed on only one of the sides of the substrate, particularly only the side thereof to be fastened to the nozzle plate 1, each of the resultant slits is shaped trapezoidal in cross section as shown in FIG. 39*a*. As seen from the figure, the opening area of the slit that faces the vibrator plate 10 is small. Therefore, a large contact area is secured between the spacer and the vibrator plate 10 which receives force from the piezoelectric vibrating members at the time of ink expelling. Further, mechanical strength of the partition walls 111 and 112 is increased on the side of the structure not having the bridges 95 and to be fastened to the vibrator plate 10.

In the above-mentioned embodiment, the slit is long enough to cover the full height of the pressure generating chamber. However, the length of the slit may be adjusted in accordance with a compliance required for the pressure generating chamber. If the length of the pressure generating chamber is so selected, the compliance optimal for the ink expelling can be obtained.

Figure 39B:
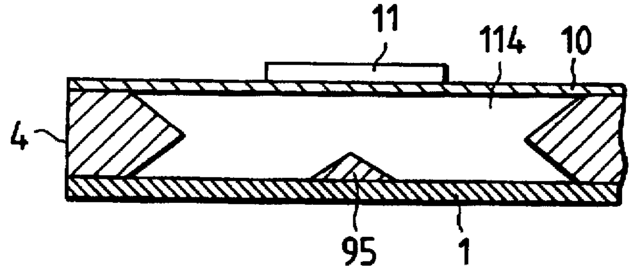
Figure 40A:
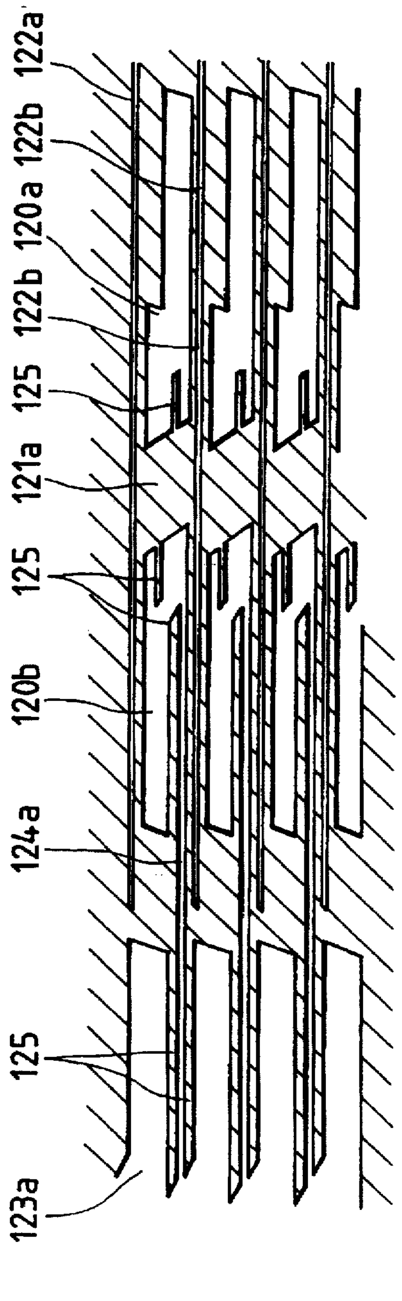
FIGS. 40*a* and 40*b* are plan views showing another type of patterns formed on the obverse and the reverse sides of the silicon single-crystal substrate.
Figure 40B:
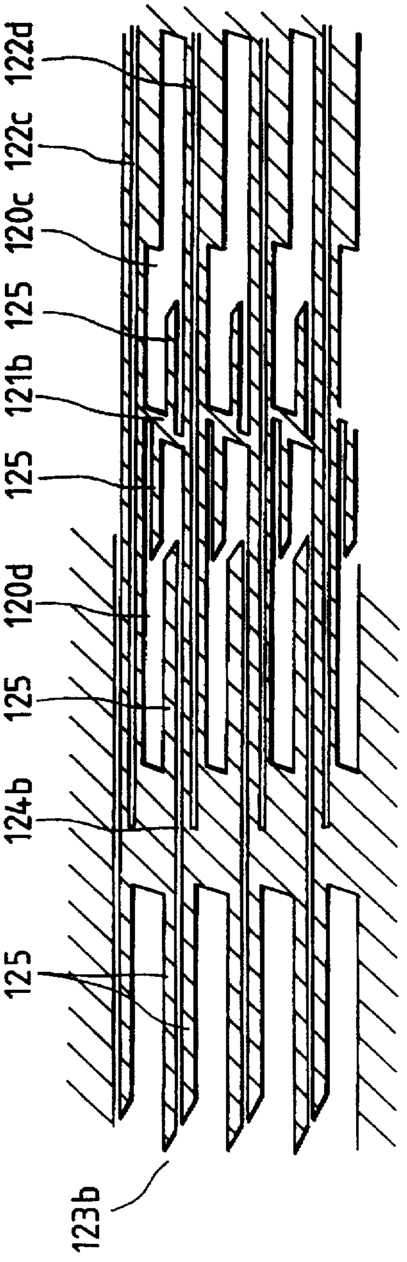

In the above-mentioned embodiment, the slits 114 are formed from only one side of the spacer or the substrate by etching process. If required, as shown in FIGS. 40*a* and 40*b*, narrow windows 122*a* and 122*b*, and 122*c* and 122*d* for forming the slits are formed on the patterns on both sides of the silicon single-crystal substrate. The slits are formed by etching the silicon single-crystal substrate from both sides thereof using the windows. In this case, the opening areas of the top and the bottom end of each slit are equal to each other, as shown in FIG. 39*b*.

When this slit forming method by processing the substrate from both sides thereof by anisotropic etching process is applied for a case where the nozzle openings are arrayed at relatively large pitches, it is easy to obtain the compliance as intended.

Figure 41:
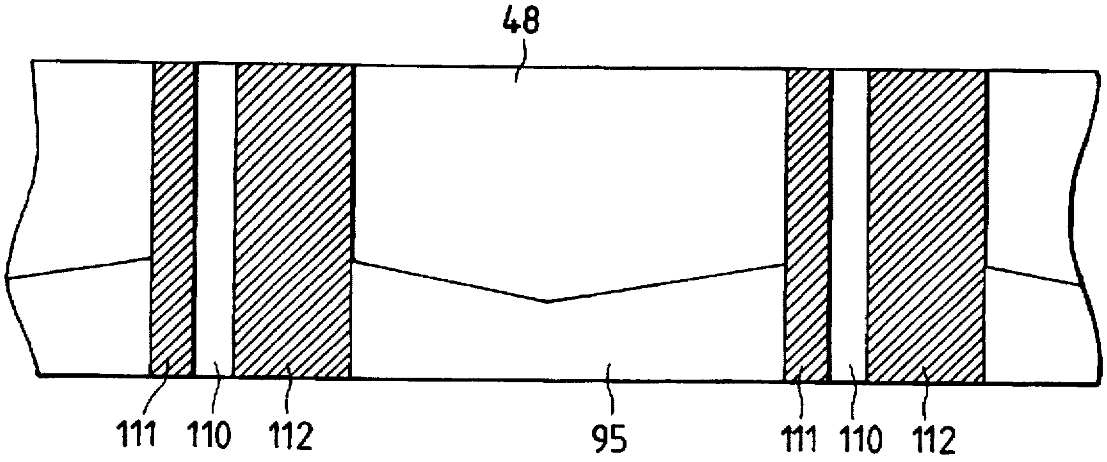
FIG. 41 is a cross sectional view showing an additional spacer.

In the above-mentioned embodiment, the partition walls horizontally defining the pressure generating chamber are uniform in thickness. However, the narrow spaces 110 may be constructed deviated to one pressure generating chamber as shown in FIG. 41. In this case, of the partition walls 111 and 112 horizontally defining the pressure generating chamber, the partition wall 111 takes the charge of the compliance.

In the above-mentioned embodiments, the so-called face ink jet printer head in which the nozzle plate, the spacer, and the vibrator plate are stacked one on another, has been discussed. It is evident that the present invention is applied to the spacer of a called edge ink jet printer head in which the nozzle plate, the spacer, and the vibrator plate are stacked one on another, and the nozzle openings are formed in the end faces of the pressure generating chambers (when longitudinally viewed).

The spacer made of silicon in which the pressure generating chambers, the spacer, and the reservoirs are formed by the path holes has been described. Another type of the spacer will be described.

Figure 42:
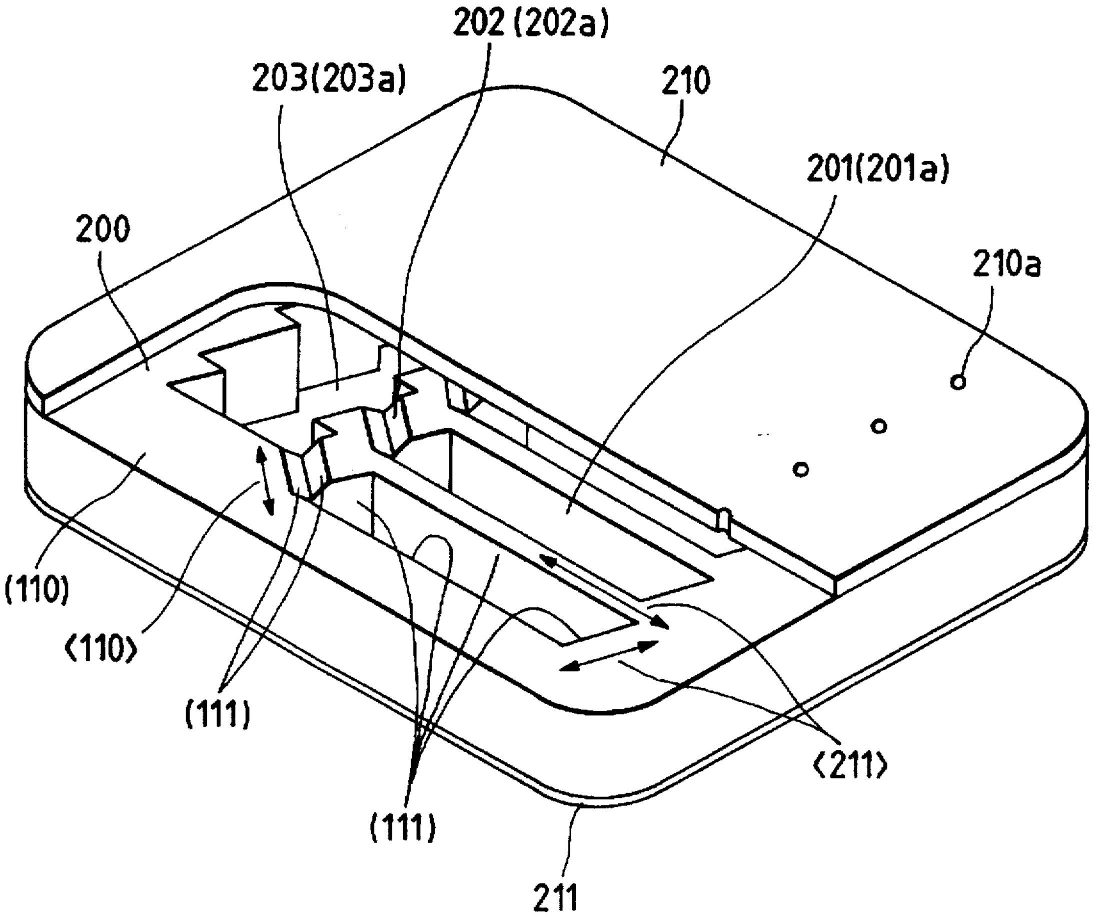
FIG. 42 is an enlarged, perspective view showing a key portion of an ink jet printer head according to an additional embodiment of the present invention.
Figure 43A:
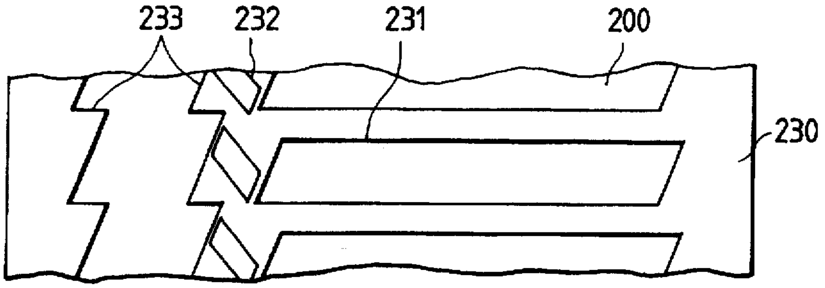
FIGS. 43(*a*) to (*d*) are plan views showing a method of manufacturing the spacer according to the present invention.
Figure 43B:
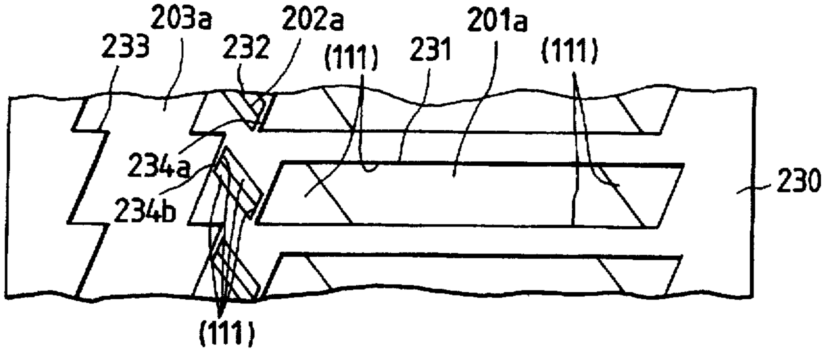
Figure 43C:
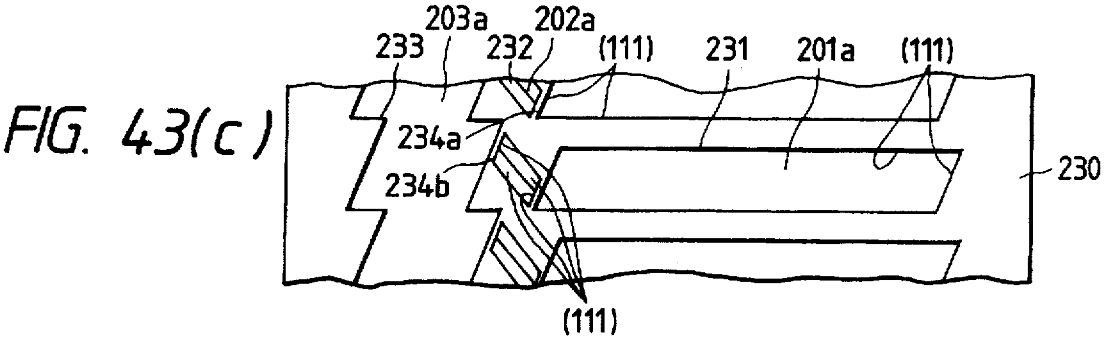
Figure 43D:
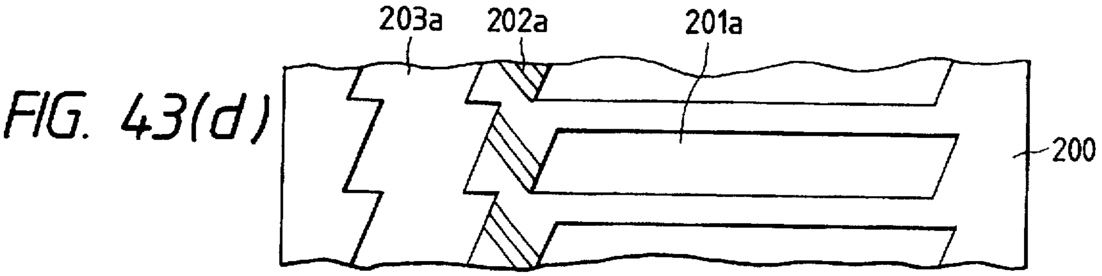

FIG. 42 is an enlarged, perspective view showing a key portion of an ink jet printer head according to a third embodiment of the present invention. In FIG. 42, a nozzle plate with nozzle openings 2*a*, a spacer 200, and a vibrator plate 211 are stacked to form ink flow paths. The spacer 200 is made of a silicon single-crystal having the crystal face vertically oriented in (110). Spaces 201*a*, 202*a*, and 203*a*, which substantially determine the volumes of the ink flow paths of pressure generating chambers 201, ink supply paths 202, and reservoir 203, are formed by called anisotropic etching process using an etching liquid in which an etching rate depends on the crystal orientation. The surface of each ink path is tempered by a protecting film (not shown) in which impurity atoms are added to silicon by thermally diffusing oxygen atoms, thereby improving the resistance properties of the ink path against ink and the affinity thereof with ink. The protecting film is not essential to the present invention. When ink used is properly selected or adjusted, there is no need of using the protecting film.

The ink supply path 202 is triangular (shaped like V) in cross section, and its volume is smaller than that of the pressure generating chamber 201 contoured rectangularly. Flow resistance of the ink supply path 202 is larger than that of the pressure generating chamber 201, thereby improving the efficiency of forcibly discharging ink droplets. At the time of ink expelling, the quantity of ink flowing into the nozzle is increased, while at the same time the quantity of ink flowing into the reservoir 203 from the ink supply path 202 is decreased. The space 201*a* to be the pressure generating chamber 201, contoured parallelogram, is enclosed by the (111) faces parallel to the crystal axes <211>. The space 202*a* to be the ink supply path 202 is defined by the (111) faces slanted parallel to the <110>axis. The space 202*a* for the ink supply path 202 is located at the acutely angled corner of the parallelogram of the pressure generating chamber 201, in order to secure a smooth flow of ink and a smooth discharge of ink bubbles.

A method of manufacturing the ink jet printer head thus structured will be described.

FIGS. 43(*a*) to 43(*d*) show a set of diagrams showing a sequence of steps for manufacturing the ink jet printer head according to the present invention.

A silicon single-crystal substrate 200 in which the crystal face of the surface of the substrate is vertically oriented in (110), is heated at 900° to 1100° C. , and placed in high temperature gas of oxidizing agent, such as oxygen or aqueous vapor, thereby diffusing oxygen atoms in the surface region of the substrate. In this embodiment, through the thermal oxidizing process, a film 230 made of silicon oxide, 1.7 μm thick, was formed. The silicon dioxide film 230 is used as a mask in the step of anisotropic etching process to be given later. Any of other methods than the thermal oxide process, such as CVD (chemical vapor deposition) method, an ion implantation method and anode oxide method, may be used for forming the film 230. The silicon substrate film may be replaced by a silicon nitride film, a called p-type silicon film added with boron or gallium atoms, or a called n-type silicon film added with arsenic or antimony atoms.

The thickness of the silicon single-crystal substrate is preferably 0.1 to 0.5 mm, more preferably 0.15 to 0.3 mm. In the present embodiment, the silicon single-crystal substrate 200 of 0.18 mm thick was used.

Resin resist is applied to the silicon single-crystal substrate, thereby forming a pattern thereon. The silicon oxide film 230 is selectively etched away using acid etching liquid, such as an aqueous solution of fluorine oxide.

After the resin resist is removed, a mask pattern of the silicon oxide film 230 that is patterned in the previous process step appears on the substrate as shown in FIG. 43(*a*). A window 231 is a location for the pressure generating chamber 201. A window 232 is a location for the ink supply path 202. A window 233 is a location for the reservoir 203.

The silicon single-crystal substrate 200 is etched by anisotropic etching process, using an etching liquid in which the etching rate varies depending on the crystal face orientation, such as an aqueous solution of sodium hydroxide or an aqueous solution of potassium hydroxide. The anisotropic etching process ends in a state shown in FIG. 43(*c*) through a state shown in FIG. 43(*b*). Specifically, the (111) face vertical to the (110) face of the surface of the silicon single-crystal substrate 200 and the (111) face slanted to the same appear in the window 231 after it undergoes the anisotropic etching process. A slanted (111) face appears also in the window. The anisotropic etching process is further continued. Then, the slanted (111) face disappears and a vertical (111) face appears anew. Through the above process steps, spaces 201*a* each of Which substantially determines the volume of a pressure generating chamber 101, spaces 202*a* each of which substantially determines the volume of the ink supply path 202, and a space 203*a* which substantially determines the volume of the reservoir 203 are formed while being partitioned by vertical (111) faces 234.

In the present embodiment, for the anisotropic etching, the silicon single-crystal substrate 200 was immersed for about 90 minutes in an aqueous solution containing sodium hydroxide of 20 wt. %, kept at 80° C. The resultant structure was as shown in FIG. 43(*c*).

A partition wall 234*a*, depending upon the vertical (111) faces, for partitioning the spaces 201*a* to be the pressure generating chambers 201 and the spaces 202*a* to be the ink supply paths, and a partition wall 234*b* for partitioning the spaces 202*a* to be the ink supply paths and the space 203*a* to be the reservoir are removed by an isotropic etching liquid, such as an aqueous solution of fluorine oxide. The silicon oxide film 230 is also removed in the etching process using the isotropic etching liquid. The etching rate in this etching process is substantially equal to that in the etching process for the silicon single-crystal substrate 200. Accordingly, the thickness of the partition walls 234 is set at 1.7 μm, equal to that of the silicon oxide film 230. Impact by ultrasonic vibrations, in place of the isotropic etching liquid, may be used for removing the partition walls 234.

Then, a protecting film (not shown) is formed for obtaining a desired resistance properties of the ink path against ink and a desired affinity thereof with ink. The type of the protecting film to be formed and the means for forming the protecting film are the same as those in the step for forming the mask pattern 230. It is suggestible to form a silicon oxide film by the thermal oxide process.

With provision of the partition walls 234 (234*a* and 234*b*) for partitioning the spaces 201*a* and 202*a*, there is eliminated an excessive etching at the acutely angled corner of the parallelogram that secondarily occurs in the anisotropic etching process. As a result, the spaces 201*a* and 202*a* can be shaped as desired.

It is noted that the ink supply paths 202 and the pressure generating chambers 201 are integrated into a single part (silicon single-crystal substrate 200). With this structure, the precise shaping as one of the advantageous features of silicon is well used to provide uniform discharging characteristics of the ink paths and less variation of the product characteristics of lots. Only the (111) faces where the etching rate is low when compared with other crystal faces are left. Accordingly, a tolerable range within which the etching conditions may be varied in the anisotropic etching process is broad. Extremely stable products can be manufactured.

Figure 44:
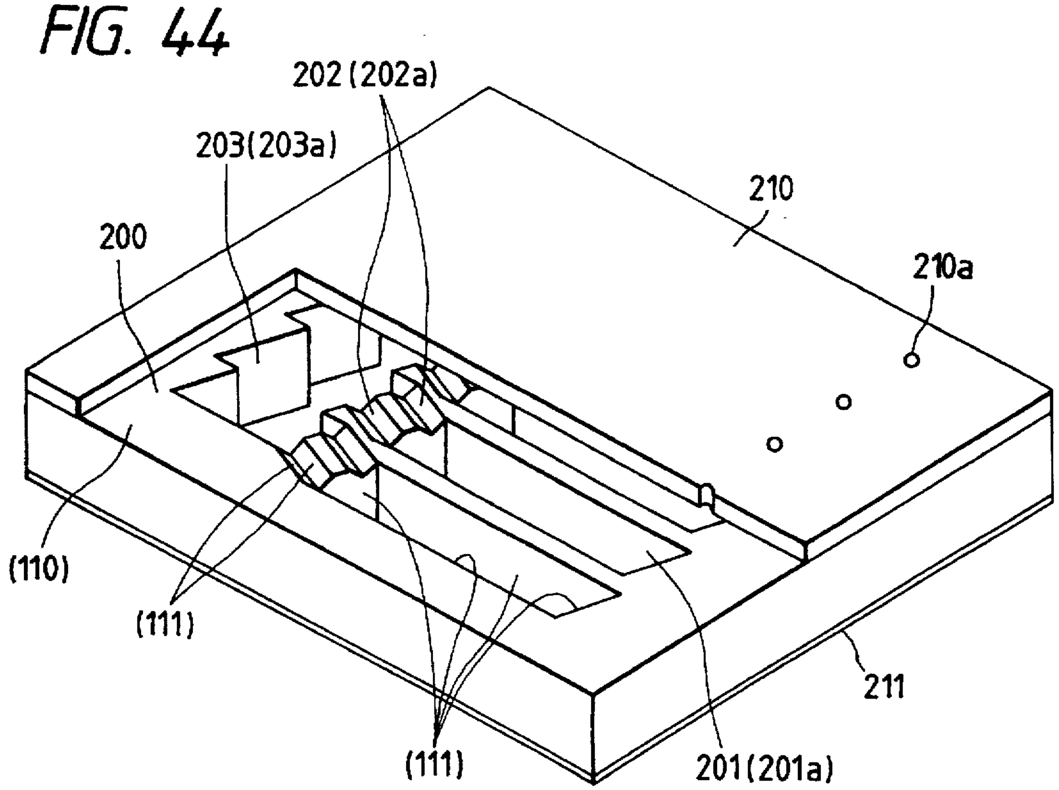
FIG. 44 is an enlarged, perspective view showing a key portion of an ink jet printer head according to a further embodiment of the present invention.

FIG. 44 is a perspective view showing a key portion of an ink jet printer head according to yet another embodiment of the present invention. In this embodiment, each pressure generating chamber 201 is provided with a plural number (two in this embodiment) of ink supply paths 202. Spaces 202*a* to be the ink supply paths 202 are respectively located the acutely and obtusely angled corners of the parallelogram of the space 201*a* to be the pressure generating chamber 201. With this, a smooth flow of ink and a smooth discharge of ink bubbles are ensured.

Figure 45:
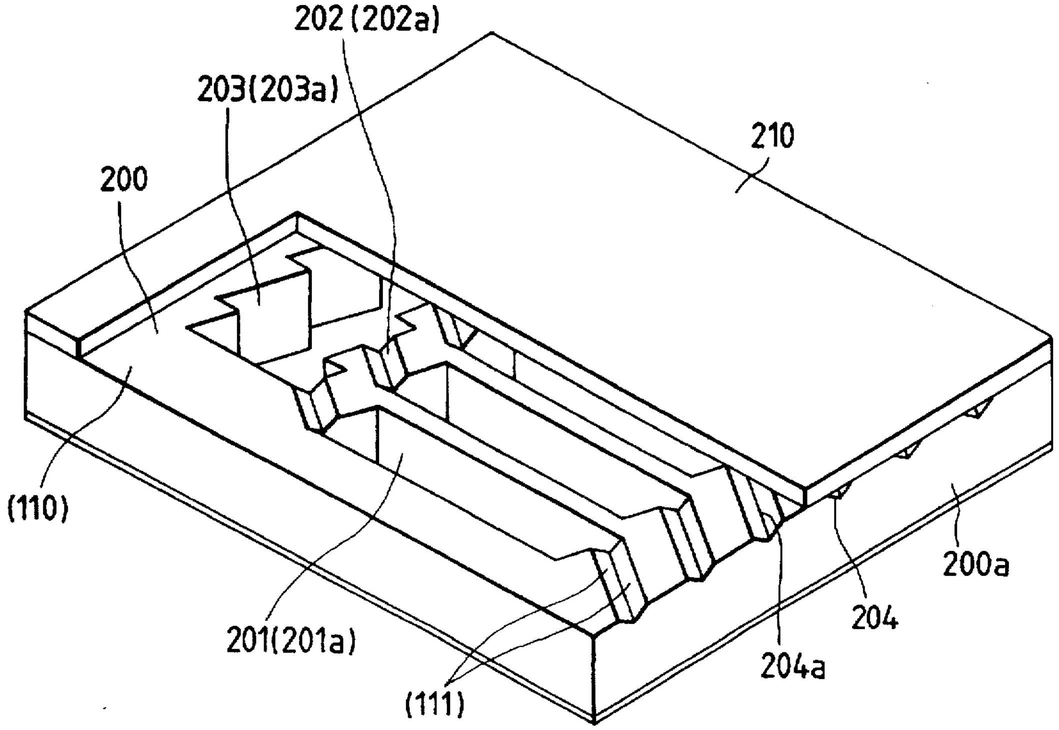
FIG. 45 is an enlarged, perspective view showing a key portion of an ink jet printer head according to another embodiment of the present invention.

FIG. 45 is a perspective view showing a key portion of an ink jet printer head according to a further embodiment of the present invention. Spaces 204*a* which substantially determine the volumes of the nozzle openings are also formed like the spaces 202*a* of the ink supply paths 202. The nozzle openings 204 are located on the peripheral edge of the silicon single-crystal substrate 200. The ink jet printer head of this embodiment is a called edge ink jet printer head. Since a plural number of the nozzle openings 204 are arrayed on one side face of the silicon single-crystal substrate 200, the peripheral edge 200*a* is finished to be flat by cutting means, such as a rotary grinder.

As described above, the plural number of the ink supply paths 202 can stably be manufactured so as to have a desired flow resistance. Those ink supply paths, together with the pressure generating chambers 201, can be formed in the silicon single-crystal substrate 200. Each ink supply path 202 is supported at both ends by the ink supply paths 202 on both sides thereof, and similarly each pressure generating chamber 201 is supported at both ends by the pressure generating chambers 201 on both sides. Therefore, easy handling of the silicon single-crystal substrate 200 after the ink supply paths 202 and the pressure generating chambers 201 are formed therein is realized although the silicon of the silicon single-crystal substrate 200 is fragile.

What is claimed is:

1. A method of manufacturing an ink jet printer head comprising the steps of:

forming a first pattern substantially aligned with the base of a bridge means triangular in cross section which is formed one of the major surfaces of the spacer; and forming at least two narrow etching protecting patterns and second etching protecting patterns for connecting the narrow etching protecting patterns to etching protecting patterns for forming one of the walls of the pressure generating chambers and the ink supply paths, the etching protecting patterns and the second etching protecting patterns being formed on the other major surface of the spacer, wherein the second etching protecting patterns are not aligned with each other so that the prolonged lines drawn on the second etching protecting patterns are not overlaid one on the other.

2. A method of processing a silicon single-crystal substrate in use with an ink jet printer head, comprising the steps of:

forming anisotropic etching protecting patterns made of silicon dioxide, coincident in configuration with patterns for forming path holes in a mirror image manner, on an obverse side and on a reverse side of the silicon single-crystal substrate vertically oriented in (110); and forming the path holes from the obverse and the reverse sides of the silicon single-crystal substrate by anisotropic etching process, wherein the anisotropic etching protecting patterns include anisotropic etching protecting patterns which are positioned at one side of silicon single-crystal substrate to form a first path hole and a second path hole which is narrower in width than the first path hole, and which are aligned with each other, and also to form an elongate etching protecting pattern extending in parallel with the second path hole and substantially aligned with an opposite wall of said second path hole.

3. The method of processing a silicon single-crystal substrate according to claim 2, wherein one of the silicon dioxide patterns located in a mirror image fashion is coincident in position with the path hole formed by the etching process, while the other is dislocated to the inner side of the path hole to be formed.

4. The method of processing a silicon single-crystal substrate according to claim 2, wherein the end region requiring a smooth wall in the first path hole is dislocated toward the second wall and an etching protecting pattern with a protruded part is formed thereon.

5. A method of processing a silicon single-crystal substrate in use with an ink jet printer head, comprising the steps of:

forming etching patterns made of silicon dioxide, coincident in configuration with patterns for forming path holes in a mirror image manner, on an obverse side and on a reverse side of the silicon single-crystal substrate vertically oriented in (110); and forming the path holes from the obverse and the reverse sides of the silicon single-crystal substrate by anisotropic etching process;

wherein the anisotropic etching protecting patterns include anisotropic etching protecting patterns which are positioned at one side of silicon single-crystal substrate to form a first path hole and a second path hole which is narrower in width than the first path hole, and which are aligned with each other, and also to form an elongate etching protecting pattern extending the longitudinal direction of the second path hole and in parallel with the second path hole.

6. The method of processing a silicon single-crystal substrate according to claim 5, wherein the end region requiring a smooth wall in the first path hole is dislocated toward the second wall and an etching protecting pattern with a protruded part is formed thereon, and the resultant structure is processed by anisotropic etching process.

7. A method of manufacturing an ink jet printer head having pressure generating chambers communicating at first ends with ink supply paths and at the second ends with nozzle openings for shooting forth ink droplets comprising the steps of:

forming first spaces each having walls of two (111) faces slanted to the surface of a silicon single-crystal substrate vertically oriented in (110) and a second space having walls of at least two (111) faces vertical to the surface of the silicon single-crystal substrate by anisotropic etching process using an etching liquid in which an etching rate depends on the crystal orientation; and removing a partition wall of the (111) face for partitioning the first and the second spaces.

8. The method of manufacturing an ink jet printer head according to claim 7, wherein the first space substantially determines the volume of the ink supply path, and the second space substantially determines the volume of the pressure generating chamber.

9. The method of manufacturing an ink jet printer head according to claim 7 wherein the first space substantially determines the volume of the nozzle opening, and the second space substantially determines the volume of the pressure generating chamber.

10. The method of manufacturing an ink jet printer head according to claim 7, wherein the partitioning walls are removed by isotropic etching process.

11. A method of forming a through hole in a silicon single-crystal substrate vertically oriented in (110) comprising:

forming, on an obverse side of said substrate, a first protective etching pattern defining a first through hole shape;

forming, on a reverse side of said substrate, a second protective etching pattern defining a second through hole shape which is smaller than said first through hole shape, said second through hole shape being aligned with said first through hole shape so that said first through hole shape overlaps all of said second through hole shape;

forming said through hole to have said first through hole shape by etching said substrate.

* * * * *